(12) United States Patent
Dash et al.

(10) Patent No.: US 12,683,123 B2
(45) Date of Patent: Jul. 14, 2026

(54) PULSED VOLTAGE WAVEFORM BIASING OF PLASMA

(71) Applicant: Applied Materials, Inc., Santa Clara, CA (US)

(72) Inventors: Shreeram Jyoti Dash, San Jose, CA (US); Michael T. Nichols, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 196 days.

(21) Appl. No.: 18/535,724

(22) Filed: Dec. 11, 2023

(65) Prior Publication Data

US 2025/0191884 A1     Jun. 12, 2025

(51) Int. Cl.
*H01J 37/32* (2006.01)

(52) U.S. Cl.
CPC .. *H01J 37/32174* (2013.01); *H01J 37/32935* (2013.01); *H01J 2237/3341* (2013.01)

(58) Field of Classification Search
None
See application file for complete search history.

(56) References Cited

U.S. PATENT DOCUMENTS

| | | | |
|---|---|---|---|
| 4,070,589 | A | 1/1978 | Martinkovic |
| 4,340,462 | A | 7/1982 | Koch |
| 4,464,223 | A | 8/1984 | Gorin |
| 4,504,895 | A | 3/1985 | Steigerwald |
| 4,585,516 | A | 4/1986 | Corn et al. |
| 4,683,529 | A | 7/1987 | Bucher, II |
| 4,931,135 | A | 6/1990 | Horiuchi et al. |
| 4,992,919 | A | 2/1991 | Lee et al. |
| 5,099,697 | A | 3/1992 | Agar |
| 5,117,279 | A | 5/1992 | Karpman |
| 5,140,510 | A | 8/1992 | Myers |
| 5,242,561 | A | 9/1993 | Sato |
| 5,449,410 | A | 9/1995 | Chang et al. |

(Continued)

FOREIGN PATENT DOCUMENTS

| | | |
|---|---|---|
| CN | 101990353 A | 3/2011 |
| CN | 102084024 A | 6/2011 |

(Continued)

OTHER PUBLICATIONS

International Search Report/ Written Opinion issued to PCT/US2024/055383 on Feb. 28, 2025.

(Continued)

*Primary Examiner* — Srinivas Sathiraju
(74) *Attorney, Agent, or Firm* — Patterson + Sheridan, LLP

(57)     ABSTRACT

Embodiments of the disclosure include apparatus (e.g., plasma processing systems) and methods for the plasma processing of a substrate in a processing chamber. Some embodiments are directed to a method for waveform generation, which generally includes delivering a radio frequency (RF) waveform at a frequency for a first period of time using a RF generator and then halting the delivery of the RF waveform for a second period of time, and delivering a pulsed voltage waveform at a first voltage for at least a portion of a third period of time using a pulser, wherein the delivery of the pulsed voltage waveform overlaps with the delivery of the RF waveform during a portion of the second period of time.

20 Claims, 6 Drawing Sheets

(56) References Cited

U.S. PATENT DOCUMENTS

| | | | |
|---|---|---|---|
| 5,451,846 A | 9/1995 | Peterson et al. |
| 5,464,499 A | 11/1995 | Moslehi et al. |
| 5,554,959 A | 9/1996 | Tang |
| 5,565,036 A | 10/1996 | Westendorp et al. |
| 5,595,627 A | 1/1997 | Inazawa et al. |
| 5,597,438 A | 1/1997 | Grewal et al. |
| 5,610,452 A | 3/1997 | Shimer et al. |
| 5,698,062 A | 12/1997 | Sakamoto et al. |
| 5,716,534 A | 2/1998 | Tsuchiya et al. |
| 5,741,446 A | 4/1998 | Tahara et al. |
| 5,770,023 A | 6/1998 | Sellers |
| 5,796,598 A | 8/1998 | Nowak et al. |
| 5,810,982 A | 9/1998 | Sellers |
| 5,830,330 A | 11/1998 | Lantsman |
| 5,882,424 A | 3/1999 | Taylor et al. |
| 5,928,963 A | 7/1999 | Koshiishi |
| 5,933,314 A | 8/1999 | Lambson et al. |
| 5,935,373 A | 8/1999 | Koshimizu |
| 5,948,704 A | 9/1999 | Benjamin et al. |
| 5,997,687 A | 12/1999 | Koshimizu |
| 6,043,607 A | 3/2000 | Roderick |
| 6,051,114 A | 4/2000 | Yao et al. |
| 6,055,150 A | 4/2000 | Clinton et al. |
| 6,074,518 A | 6/2000 | Imafuku et al. |
| 6,089,181 A | 7/2000 | Suemasa et al. |
| 6,099,697 A | 8/2000 | Hausmann |
| 6,110,287 A | 8/2000 | Arai et al. |
| 6,117,279 A | 9/2000 | Smolanoff et al. |
| 6,125,025 A | 9/2000 | Howald et al. |
| 6,133,557 A | 10/2000 | Kawanabe et al. |
| 6,136,387 A | 10/2000 | Koizumi |
| 6,187,685 B1 | 2/2001 | Hopkins et al. |
| 6,197,151 B1 | 3/2001 | Kaji et al. |
| 6,198,616 B1 | 3/2001 | Dahimene et al. |
| 6,201,208 B1 | 3/2001 | Wendt et al. |
| 6,214,162 B1 | 4/2001 | Koshimizu |
| 6,232,236 B1 | 5/2001 | Shan et al. |
| 6,252,354 B1 | 6/2001 | Collins et al. |
| 6,253,704 B1 | 7/2001 | Savas |
| 6,277,506 B1 | 8/2001 | Okamoto |
| 6,309,978 B1 | 10/2001 | Donohoe et al. |
| 6,313,583 B1 | 11/2001 | Arita et al. |
| 6,355,992 B1 | 3/2002 | Via |
| 6,358,573 B1 | 3/2002 | Raoux et al. |
| 6,367,413 B1 | 4/2002 | Sill et al. |
| 6,392,187 B1 | 5/2002 | Johnson |
| 6,395,641 B2 | 5/2002 | Savas |
| 6,413,358 B2 | 7/2002 | Donohoe |
| 6,423,192 B1 | 7/2002 | Wada et al. |
| 6,433,297 B1 | 8/2002 | Kojima et al. |
| 6,435,131 B1 | 8/2002 | Koizumi |
| 6,451,389 B1 | 9/2002 | Amann et al. |
| 6,456,010 B2 | 9/2002 | Yamakoshi et al. |
| 6,483,731 B1 | 11/2002 | Isurin et al. |
| 6,535,785 B2 | 3/2003 | Johnson et al. |
| 6,621,674 B1 | 9/2003 | Zahringer et al. |
| 6,664,739 B1 | 12/2003 | Kishinevsky et al. |
| 6,733,624 B2 | 5/2004 | Koshiishi et al. |
| 6,740,842 B2 | 5/2004 | Johnson et al. |
| 6,777,037 B2 | 8/2004 | Sumiya et al. |
| 6,808,607 B2 | 10/2004 | Christie |
| 6,818,103 B1 | 11/2004 | Scholl et al. |
| 6,818,257 B2 | 11/2004 | Amann et al. |
| 6,830,595 B2 | 12/2004 | Reynolds, III |
| 6,830,650 B2 | 12/2004 | Roche et al. |
| 6,849,154 B2 | 2/2005 | Nagahata et al. |
| 6,861,373 B2 | 3/2005 | Aoki et al. |
| 6,863,020 B2 | 3/2005 | Mitrovic et al. |
| 6,896,775 B2 | 5/2005 | Chistyakov |
| 6,902,646 B2 | 6/2005 | Mahoney et al. |
| 6,917,204 B2 | 7/2005 | Mitrovic et al. |
| 6,947,300 B2 | 9/2005 | Pai et al. |
| 6,962,664 B2 | 11/2005 | Mitrovic |
| 6,970,042 B2 | 11/2005 | Glueck |
| 6,972,524 B1 | 12/2005 | Marakhtanov et al. |
| 7,016,620 B2 | 3/2006 | Maess et al. |
| 7,046,088 B2 | 5/2006 | Ziegler |
| 7,059,267 B2 | 6/2006 | Hedberg et al. |
| 7,104,217 B2 | 9/2006 | Himori et al. |
| 7,115,185 B1 | 10/2006 | Gonzalez et al. |
| 7,126,808 B2 | 10/2006 | Koo et al. |
| 7,147,759 B2 | 12/2006 | Chistyakov |
| 7,151,242 B2 | 12/2006 | Schuler |
| 7,166,233 B2 | 1/2007 | Johnson et al. |
| 7,183,177 B2 | 2/2007 | Al-Bayati et al. |
| 7,206,189 B2 | 4/2007 | Reynolds, III |
| 7,218,503 B2 | 5/2007 | Howald |
| 7,218,872 B2 | 5/2007 | Shimomura |
| 7,226,868 B2 | 6/2007 | Mosden et al. |
| 7,265,963 B2 | 9/2007 | Hirose |
| 7,274,266 B2 | 9/2007 | Kirchmeier |
| 7,305,311 B2 | 12/2007 | van Zyl |
| 7,312,974 B2 | 12/2007 | Kuchimachi |
| 7,408,329 B2 | 8/2008 | Wiedemuth et al. |
| 7,415,940 B2 | 8/2008 | Koshimizu et al. |
| 7,440,301 B2 | 10/2008 | Kirchmeier et al. |
| 7,452,443 B2 | 11/2008 | Gluck et al. |
| 7,479,712 B2 | 1/2009 | Richert et al. |
| 7,509,105 B2 | 3/2009 | Ziegler |
| 7,512,387 B2 | 3/2009 | Glueck |
| 7,535,688 B2 | 5/2009 | Yokouchi et al. |
| 7,586,099 B2 | 9/2009 | Eyhorn et al. |
| 7,586,210 B2 | 9/2009 | Wiedemuth et al. |
| 7,588,667 B2 | 9/2009 | Cerio, Jr. |
| 7,601,246 B2 | 10/2009 | Kim et al. |
| 7,609,740 B2 | 10/2009 | Glueck |
| 7,618,686 B2 | 11/2009 | Colpo et al. |
| 7,633,319 B2 | 12/2009 | Arai |
| 7,645,341 B2 | 1/2010 | Kennedy et al. |
| 7,651,586 B2 | 1/2010 | Moriya et al. |
| 7,652,901 B2 | 1/2010 | Kirchmeier et al. |
| 7,692,936 B2 | 4/2010 | Richter |
| 7,700,474 B2 | 4/2010 | Cerio, Jr. |
| 7,705,676 B2 | 4/2010 | Kirchmeier et al. |
| 7,706,907 B2 | 4/2010 | Hiroki |
| 7,718,538 B2 | 5/2010 | Kim et al. |
| 7,740,704 B2 | 6/2010 | Strang |
| 7,758,764 B2 | 7/2010 | Dhindsa et al. |
| 7,761,247 B2 | 7/2010 | van Zyl |
| 7,782,100 B2 | 8/2010 | Steuber et al. |
| 7,791,912 B2 | 9/2010 | Walde |
| 7,795,817 B2 | 9/2010 | Nitschke |
| 7,808,184 B2 | 10/2010 | Chistyakov |
| 7,821,767 B2 | 10/2010 | Fujii |
| 7,825,719 B2 | 11/2010 | Roberg et al. |
| 7,858,533 B2 | 12/2010 | Liu et al. |
| 7,888,240 B2 | 2/2011 | Hamamjy et al. |
| 7,898,238 B2 | 3/2011 | Wiedemuth et al. |
| 7,929,261 B2 | 4/2011 | Wiedemuth |
| RE42,362 E | 5/2011 | Schuler |
| 7,977,256 B2 | 7/2011 | Liu et al. |
| 7,988,816 B2 | 8/2011 | Koshiishi et al. |
| 7,995,313 B2 | 8/2011 | Nitschke |
| 8,044,595 B2 | 10/2011 | Nitschke |
| 8,052,798 B2 | 11/2011 | Moriya et al. |
| 8,055,203 B2 | 11/2011 | Choueiry et al. |
| 8,083,961 B2 | 12/2011 | Chen et al. |
| 8,110,992 B2 | 2/2012 | Nitschke |
| 8,128,831 B2 | 3/2012 | Sato et al. |
| 8,129,653 B2 | 3/2012 | Kirchmeier et al. |
| 8,133,347 B2 | 3/2012 | Gluck et al. |
| 8,133,359 B2 | 3/2012 | Nauman et al. |
| 8,140,292 B2 | 3/2012 | Wendt |
| 8,217,299 B2 | 7/2012 | Ilic et al. |
| 8,221,582 B2 | 7/2012 | Patrick et al. |
| 8,236,109 B2 | 8/2012 | Moriya et al. |
| 8,284,580 B2 | 10/2012 | Wilson |
| 8,313,612 B2 | 11/2012 | McMillin et al. |
| 8,313,664 B2 | 11/2012 | Chen et al. |
| 8,333,114 B2 | 12/2012 | Hayashi |
| 8,361,906 B2 | 1/2013 | Lee et al. |
| 8,382,999 B2 | 2/2013 | Agarwal et al. |
| 8,383,001 B2 | 2/2013 | Mochiki et al. |
| 8,384,403 B2 | 2/2013 | Zollner et al. |

(56) References Cited

U.S. PATENT DOCUMENTS

| | | |
|---|---|---|
| 8,391,025 B2 | 3/2013 | Walde et al. |
| 8,399,366 B1 | 3/2013 | Takaba |
| 8,419,959 B2 | 4/2013 | Bettencourt et al. |
| 8,422,193 B2 | 4/2013 | Tao et al. |
| 8,441,772 B2 | 5/2013 | Yoshikawa et al. |
| 8,456,220 B2 | 6/2013 | Thome et al. |
| 8,460,567 B2 | 6/2013 | Chen |
| 8,466,622 B2 | 6/2013 | Knaus |
| 8,542,076 B2 | 9/2013 | Maier |
| 8,551,289 B2 | 10/2013 | Nishimura et al. |
| 8,568,606 B2 | 10/2013 | Ohse et al. |
| 8,603,293 B2 | 12/2013 | Koshiishi et al. |
| 8,632,537 B2 | 1/2014 | McNall, III et al. |
| 8,641,916 B2 | 2/2014 | Yatsuda et al. |
| 8,685,267 B2 | 4/2014 | Yatsuda et al. |
| 8,704,607 B2 | 4/2014 | Yuzurihara et al. |
| 8,716,114 B2 | 5/2014 | Ohmi et al. |
| 8,716,984 B2 | 5/2014 | Mueller et al. |
| 8,735,291 B2 | 5/2014 | Ranjan et al. |
| 8,796,933 B2 | 8/2014 | Hermanns |
| 8,809,199 B2 | 8/2014 | Nishizuka |
| 8,821,684 B2 | 9/2014 | Ui et al. |
| 8,828,883 B2 | 9/2014 | Rueger |
| 8,845,810 B2 | 9/2014 | Hwang |
| 8,852,347 B2 | 10/2014 | Lee et al. |
| 8,884,523 B2 | 11/2014 | Winterhalter et al. |
| 8,884,525 B2 | 11/2014 | Hoffman et al. |
| 8,889,534 B1 | 11/2014 | Ventzek et al. |
| 8,895,942 B2 | 11/2014 | Liu et al. |
| 8,907,259 B2 | 12/2014 | Kasai et al. |
| 8,916,056 B2 | 12/2014 | Koo et al. |
| 8,926,850 B2 | 1/2015 | Singh et al. |
| 8,963,377 B2 | 2/2015 | Ziemba et al. |
| 8,979,842 B2 | 3/2015 | McNall, III et al. |
| 8,993,943 B2 | 3/2015 | Pohl et al. |
| 9,011,636 B2 | 4/2015 | Ashida |
| 9,039,871 B2 | 5/2015 | Nauman et al. |
| 9,042,121 B2 | 5/2015 | Walde et al. |
| 9,053,908 B2 | 6/2015 | Sriraman et al. |
| 9,059,178 B2 | 6/2015 | Matsumoto et al. |
| 9,087,798 B2 | 7/2015 | Ohtake et al. |
| 9,101,038 B2 | 8/2015 | Singh et al. |
| 9,105,447 B2 | 8/2015 | Brouk et al. |
| 9,105,452 B2 | 8/2015 | Jeon et al. |
| 9,123,762 B2 | 9/2015 | Lin et al. |
| 9,129,776 B2 | 9/2015 | Finley et al. |
| 9,139,910 B2 | 9/2015 | Lee et al. |
| 9,147,555 B2 | 9/2015 | Richter |
| 9,150,960 B2 | 10/2015 | Nauman et al. |
| 9,159,575 B2 | 10/2015 | Ranjan et al. |
| 9,208,992 B2 | 12/2015 | Brouk et al. |
| 9,209,032 B2 | 12/2015 | Zhao et al. |
| 9,209,034 B2 | 12/2015 | Kitamura et al. |
| 9,210,790 B2 | 12/2015 | Hoffman et al. |
| 9,224,579 B2 | 12/2015 | Finley et al. |
| 9,226,380 B2 | 12/2015 | Finley |
| 9,228,878 B2 | 1/2016 | Haw et al. |
| 9,254,168 B2 | 2/2016 | Palanker |
| 9,263,241 B2 | 2/2016 | Larson et al. |
| 9,287,086 B2 | 3/2016 | Brouk et al. |
| 9,287,092 B2 | 3/2016 | Brouk et al. |
| 9,287,098 B2 | 3/2016 | Finley |
| 9,306,533 B1 | 4/2016 | Mavretic |
| 9,309,594 B2 | 4/2016 | Hoffman et al. |
| 9,313,872 B2 | 4/2016 | Yamazawa et al. |
| 9,355,822 B2 | 5/2016 | Yamada et al. |
| 9,362,089 B2 | 6/2016 | Brouk et al. |
| 9,373,521 B2 | 6/2016 | Mochiki et al. |
| 9,384,992 B2 | 7/2016 | Narishige et al. |
| 9,396,960 B2 | 7/2016 | Ogawa et al. |
| 9,404,176 B2 | 8/2016 | Parkhe et al. |
| 9,412,613 B2 | 8/2016 | Manna et al. |
| 9,435,029 B2 | 9/2016 | Brouk et al. |
| 9,483,066 B2 | 11/2016 | Finley |
| 9,490,107 B2 | 11/2016 | Kim et al. |
| 9,495,563 B2 | 11/2016 | Ziemba et al. |
| 9,496,150 B2 | 11/2016 | Mochiki et al. |
| 9,503,006 B2 | 11/2016 | Pohl et al. |
| 9,520,269 B2 | 12/2016 | Finley et al. |
| 9,530,667 B2 | 12/2016 | Rastogi et al. |
| 9,536,713 B2 | 1/2017 | Van Zyl et al. |
| 9,544,987 B2 | 1/2017 | Mueller et al. |
| 9,558,917 B2 | 1/2017 | Finley et al. |
| 9,564,287 B2 | 2/2017 | Ohse et al. |
| 9,570,313 B2 | 2/2017 | Ranjan et al. |
| 9,576,810 B2 | 2/2017 | Deshmukh et al. |
| 9,576,816 B2 | 2/2017 | Rastogi et al. |
| 9,577,516 B1 | 2/2017 | Van Zyl |
| 9,583,357 B1 | 2/2017 | Long et al. |
| 9,593,421 B2 | 3/2017 | Baek et al. |
| 9,601,283 B2 | 3/2017 | Ziemba et al. |
| 9,601,319 B1 | 3/2017 | Bravo et al. |
| 9,607,843 B2 | 3/2017 | Rastogi et al. |
| 9,620,340 B2 | 4/2017 | Finley |
| 9,620,376 B2 | 4/2017 | Kamp et al. |
| 9,620,987 B2 | 4/2017 | Alexander et al. |
| 9,637,814 B2 | 5/2017 | Bugyi et al. |
| 9,644,221 B2 | 5/2017 | Kanamori et al. |
| 9,651,957 B1 | 5/2017 | Finley |
| 9,655,221 B2 | 5/2017 | Ziemba et al. |
| 9,663,858 B2 | 5/2017 | Nagami et al. |
| 9,666,446 B2 | 5/2017 | Tominaga et al. |
| 9,666,447 B2 | 5/2017 | Rastogi et al. |
| 9,673,027 B2 | 6/2017 | Yamamoto et al. |
| 9,673,059 B2 | 6/2017 | Raley et al. |
| 9,685,297 B2 | 6/2017 | Carter et al. |
| 9,706,630 B2 | 7/2017 | Miller et al. |
| 9,711,331 B2 | 7/2017 | Mueller et al. |
| 9,711,335 B2 | 7/2017 | Christie |
| 9,728,429 B2 | 8/2017 | Ricci et al. |
| 9,734,992 B2 | 8/2017 | Yamada et al. |
| 9,741,544 B2 | 8/2017 | Van Zyl |
| 9,754,768 B2 | 9/2017 | Yamada et al. |
| 9,761,419 B2 | 9/2017 | Nagami |
| 9,761,459 B2 | 9/2017 | Long et al. |
| 9,767,988 B2 | 9/2017 | Brouk et al. |
| 9,786,503 B2 | 10/2017 | Raley et al. |
| 9,799,494 B2 | 10/2017 | Chen et al. |
| 9,805,916 B2 | 10/2017 | Konno et al. |
| 9,805,965 B2 | 10/2017 | Sadjadi et al. |
| 9,812,305 B2 | 11/2017 | Pelleymounter |
| 9,831,064 B2 | 11/2017 | Konno et al. |
| 9,837,285 B2 | 12/2017 | Tomura et al. |
| 9,840,770 B2 | 12/2017 | Klimczak et al. |
| 9,852,889 B1 | 12/2017 | Kellogg et al. |
| 9,852,890 B2 | 12/2017 | Mueller et al. |
| 9,865,471 B2 | 1/2018 | Shimoda et al. |
| 9,865,893 B2 | 1/2018 | Esswein et al. |
| 9,870,898 B2 | 1/2018 | Urakawa et al. |
| 9,872,373 B1 | 1/2018 | Shimizu et al. |
| 9,881,820 B2 | 1/2018 | Wong et al. |
| 9,922,802 B2 | 3/2018 | Hirano et al. |
| 9,922,806 B2 | 3/2018 | Tomura et al. |
| 9,929,004 B2 | 3/2018 | Ziemba et al. |
| 9,941,097 B2 | 4/2018 | Yamazawa et al. |
| 9,941,098 B2 | 4/2018 | Nagami |
| 9,960,763 B2 | 5/2018 | Miller et al. |
| 9,972,503 B2 | 5/2018 | Tomura et al. |
| 9,997,374 B2 | 6/2018 | Takeda et al. |
| 10,020,800 B2 | 7/2018 | Prager et al. |
| 10,026,593 B2 | 7/2018 | Alt et al. |
| 10,027,314 B2 | 7/2018 | Prager et al. |
| 10,041,174 B2 | 8/2018 | Matsumoto et al. |
| 10,042,407 B2 | 8/2018 | Grede et al. |
| 10,063,062 B2 | 8/2018 | Voronin et al. |
| 10,074,518 B2 | 9/2018 | Van Zyl |
| 10,085,796 B2 | 10/2018 | Podany |
| 10,090,191 B2 | 10/2018 | Tomura et al. |
| 10,102,321 B2 | 10/2018 | Povolny et al. |
| 10,109,461 B2 | 10/2018 | Yamada et al. |
| 10,115,567 B2 | 10/2018 | Hirano et al. |
| 10,115,568 B2 | 10/2018 | Kellogg et al. |
| 10,176,970 B2 | 1/2019 | Nitschke |
| 10,176,971 B2 | 1/2019 | Nagami |

(56) References Cited

U.S. PATENT DOCUMENTS

| | | | |
|---|---|---|---|
| 10,181,392 | B2 | 1/2019 | Leypold et al. |
| 10,199,246 | B2 | 2/2019 | Koizumi et al. |
| 10,217,618 | B2 | 2/2019 | Larson et al. |
| 10,217,933 | B2 | 2/2019 | Nishimura et al. |
| 10,224,822 | B2 | 3/2019 | Miller et al. |
| 10,229,819 | B2 | 3/2019 | Hirano et al. |
| 10,249,498 | B2 | 4/2019 | Ventzek et al. |
| 10,268,846 | B2 | 4/2019 | Miller et al. |
| 10,269,540 | B1 | 4/2019 | Carter et al. |
| 10,276,420 | B2 | 4/2019 | Ito et al. |
| 10,282,567 | B2 | 5/2019 | Miller et al. |
| 10,283,321 | B2 | 5/2019 | Yang et al. |
| 10,290,506 | B2 | 5/2019 | Ranjan et al. |
| 10,297,431 | B2 | 5/2019 | Zelechowski et al. |
| 10,304,661 | B2 | 5/2019 | Ziemba et al. |
| 10,304,668 | B2 | 5/2019 | Coppa et al. |
| 10,312,048 | B2 | 6/2019 | Dorf et al. |
| 10,312,056 | B2 | 6/2019 | Collins et al. |
| 10,320,373 | B2 | 6/2019 | Prager et al. |
| 10,332,730 | B2 | 6/2019 | Christie |
| 10,340,123 | B2 | 7/2019 | Ohtake |
| 10,348,186 | B2 | 7/2019 | Schuler et al. |
| 10,354,839 | B2 | 7/2019 | Alt et al. |
| 10,373,755 | B2 | 8/2019 | Prager et al. |
| 10,373,804 | B2 | 8/2019 | Koh et al. |
| 10,373,811 | B2 | 8/2019 | Christie et al. |
| 10,381,237 | B2 | 8/2019 | Takeda et al. |
| 10,382,022 | B2 | 8/2019 | Prager et al. |
| 10,387,166 | B2 | 8/2019 | Preston et al. |
| 10,388,544 | B2 | 8/2019 | Ui et al. |
| 10,389,345 | B2 | 8/2019 | Ziemba et al. |
| 10,410,877 | B2 | 9/2019 | Takashima et al. |
| 10,431,437 | B2 | 10/2019 | Gapinski et al. |
| 10,438,797 | B2 | 10/2019 | Cottle et al. |
| 10,446,453 | B2 | 10/2019 | Coppa et al. |
| 10,447,174 | B1 | 10/2019 | Porter, Jr. et al. |
| 10,448,494 | B1 | 10/2019 | Dorf et al. |
| 10,448,495 | B1 | 10/2019 | Dorf et al. |
| 10,453,656 | B2 | 10/2019 | Carducci et al. |
| 10,460,910 | B2 | 10/2019 | Ziemba et al. |
| 10,460,911 | B2 | 10/2019 | Ziemba et al. |
| 10,460,916 | B2 | 10/2019 | Boyd, Jr. et al. |
| 10,483,089 | B2 | 11/2019 | Ziemba et al. |
| 10,483,100 | B2 | 11/2019 | Ishizaka et al. |
| 10,510,575 | B2 | 12/2019 | Kraus et al. |
| 10,522,343 | B2 | 12/2019 | Tapily et al. |
| 10,535,502 | B2 | 1/2020 | Carducci et al. |
| 10,546,728 | B2 | 1/2020 | Carducci et al. |
| 10,553,407 | B2 | 2/2020 | Nagami et al. |
| 10,555,412 | B2 | 2/2020 | Dorf et al. |
| 10,580,620 | B2 | 3/2020 | Carducci et al. |
| 10,593,519 | B2 | 3/2020 | Yamada et al. |
| 10,607,813 | B2 | 3/2020 | Fairbairn et al. |
| 10,607,814 | B2 | 3/2020 | Ziemba et al. |
| 10,658,189 | B2 | 5/2020 | Hatazaki et al. |
| 10,659,019 | B2 | 5/2020 | Slobodov et al. |
| 10,665,434 | B2 | 5/2020 | Matsumoto et al. |
| 10,666,198 | B2 | 5/2020 | Prager et al. |
| 10,672,589 | B2 | 6/2020 | Koshimizu et al. |
| 10,672,596 | B2 | 6/2020 | Brcka |
| 10,672,616 | B2 | 6/2020 | Kubota |
| 10,685,807 | B2 | 6/2020 | Dorf et al. |
| 10,707,053 | B2 | 7/2020 | Urakawa et al. |
| 10,707,054 | B1 | 7/2020 | Kubota |
| 10,707,055 | B2 | 7/2020 | Shaw et al. |
| 10,707,086 | B2 | 7/2020 | Yang et al. |
| 10,707,090 | B2 | 7/2020 | Takayama et al. |
| 10,707,864 | B2 | 7/2020 | Miller et al. |
| 10,714,372 | B2 | 7/2020 | Chua et al. |
| 10,720,305 | B2 | 7/2020 | Van Zyl |
| 10,734,906 | B2 | 8/2020 | Miller et al. |
| 10,748,746 | B2 | 8/2020 | Kaneko et al. |
| 10,755,894 | B2 | 8/2020 | Hirano et al. |
| 10,763,150 | B2 | 9/2020 | Lindley et al. |
| 10,773,282 | B2 | 9/2020 | Coppa et al. |
| 10,774,423 | B2 | 9/2020 | Janakiraman et al. |
| 10,777,388 | B2 | 9/2020 | Ziemba et al. |
| 10,790,816 | B2 | 9/2020 | Ziemba et al. |
| 10,791,617 | B2 | 9/2020 | Dorf et al. |
| 10,796,887 | B2 | 10/2020 | Prager et al. |
| 10,804,886 | B2 | 10/2020 | Miller et al. |
| 10,811,227 | B2 | 10/2020 | Van Zyl et al. |
| 10,811,228 | B2 | 10/2020 | Van Zyl et al. |
| 10,811,229 | B2 | 10/2020 | Van Zyl et al. |
| 10,811,230 | B2 | 10/2020 | Ziemba et al. |
| 10,811,296 | B2 | 10/2020 | Cho et al. |
| 10,847,346 | B2 | 11/2020 | Ziemba et al. |
| 10,892,140 | B2 | 1/2021 | Ziemba et al. |
| 10,892,141 | B2 | 1/2021 | Ziemba et al. |
| 10,896,807 | B2 | 1/2021 | Fairbairn et al. |
| 10,896,809 | B2 | 1/2021 | Ziemba et al. |
| 10,903,047 | B2 | 1/2021 | Ziemba et al. |
| 10,904,996 | B2 | 1/2021 | Koh et al. |
| 10,916,408 | B2 | 2/2021 | Dorf et al. |
| 10,923,320 | B2 | 2/2021 | Koh et al. |
| 10,923,321 | B2 | 2/2021 | Dorf et al. |
| 10,923,367 | B2 | 2/2021 | Lubomirsky et al. |
| 10,923,379 | B2 | 2/2021 | Liu et al. |
| 10,971,342 | B2 | 4/2021 | Engelstaedter et al. |
| 10,978,274 | B2 | 4/2021 | Kubota |
| 10,978,955 | B2 | 4/2021 | Ziemba et al. |
| 10,985,740 | B2 | 4/2021 | Prager et al. |
| 10,991,553 | B2 | 4/2021 | Ziemba et al. |
| 10,991,554 | B2 | 4/2021 | Zhao et al. |
| 10,998,169 | B2 | 5/2021 | Ventzek et al. |
| 11,004,660 | B2 | 5/2021 | Prager et al. |
| 11,011,349 | B2 | 5/2021 | Brouk et al. |
| 11,075,058 | B2 | 7/2021 | Ziemba et al. |
| 11,095,280 | B2 | 8/2021 | Ziemba et al. |
| 11,101,108 | B2 | 8/2021 | Slobodov et al. |
| 11,108,384 | B2 | 8/2021 | Prager et al. |
| 11,462,388 | B2 * | 10/2022 | Dorf ................. H01J 37/32715 |
| 11,462,389 | B2 * | 10/2022 | Dorf ................... H01L 21/6831 |
| 11,476,089 | B2 * | 10/2022 | Koshimizu ......... H01L 21/3065 |
| 11,694,876 | B2 * | 7/2023 | Rogers ............. H01J 37/32174 |
| | | | 438/714 |
| 11,742,181 | B2 * | 8/2023 | Koshimizu ....... H01J 37/32174 |
| | | | 315/111.21 |
| 11,776,789 | B2 * | 10/2023 | Dorf ................. H01J 37/32146 |
| | | | 315/111.21 |
| 11,848,176 | B2 * | 12/2023 | Dorf ................. H01J 37/32715 |
| 12,237,148 | B2 * | 2/2025 | Dorf ................. H01J 37/32715 |
| 2001/0003298 | A1 | 6/2001 | Shamouilian et al. |
| 2001/0009139 | A1 | 7/2001 | Shan et al. |
| 2001/0033755 | A1 | 10/2001 | Ino et al. |
| 2002/0069971 | A1 | 6/2002 | Kaji et al. |
| 2002/0078891 | A1 | 6/2002 | Chu et al. |
| 2003/0026060 | A1 | 2/2003 | Hiramatsu et al. |
| 2003/0029859 | A1 | 2/2003 | Knoot et al. |
| 2003/0049558 | A1 | 3/2003 | Aoki et al. |
| 2003/0052085 | A1 | 3/2003 | Parsons |
| 2003/0079983 | A1 | 5/2003 | Long et al. |
| 2003/0091355 | A1 | 5/2003 | Jeschonek et al. |
| 2003/0151372 | A1 | 8/2003 | Tsuchiya et al. |
| 2003/0165044 | A1 | 9/2003 | Yamamoto |
| 2003/0201069 | A1 | 10/2003 | Johnson |
| 2004/0040665 | A1 | 3/2004 | Mizuno et al. |
| 2004/0040931 | A1 | 3/2004 | Koshiishi et al. |
| 2004/0066601 | A1 | 4/2004 | Larsen |
| 2004/0112536 | A1 | 6/2004 | Quon |
| 2004/0223284 | A1 | 11/2004 | Iwami et al. |
| 2005/0022933 | A1 | 2/2005 | Howard |
| 2005/0024809 | A1 | 2/2005 | Kuchimachi |
| 2005/0039852 | A1 | 2/2005 | Roche et al. |
| 2005/0092596 | A1 | 5/2005 | Kouznetsov |
| 2005/0098118 | A1 | 5/2005 | Amann et al. |
| 2005/0151544 | A1 | 7/2005 | Mahoney et al. |
| 2005/0152159 | A1 | 7/2005 | Isurin et al. |
| 2005/0286916 | A1 | 12/2005 | Nakazato et al. |
| 2006/0075969 | A1 | 4/2006 | Fischer |
| 2006/0130767 | A1 | 6/2006 | Herchen |
| 2006/0139843 | A1 | 6/2006 | Kim |
| 2006/0158823 | A1 | 7/2006 | Mizuno et al. |
| 2006/0171848 | A1 | 8/2006 | Roche et al. |

(56) References Cited

U.S. PATENT DOCUMENTS

| | | |
|---|---|---|
| 2006/0219178 A1 | 10/2006 | Asakura |
| 2006/0278521 A1 | 12/2006 | Stowell |
| 2007/0113787 A1 | 5/2007 | Higashiura et al. |
| 2007/0114981 A1 | 5/2007 | Vasquez et al. |
| 2007/0196977 A1 | 8/2007 | Wang et al. |
| 2007/0284344 A1 | 12/2007 | Todorov et al. |
| 2007/0285869 A1 | 12/2007 | Howald |
| 2007/0297118 A1 | 12/2007 | Fujii |
| 2008/0012548 A1 | 1/2008 | Gerhardt et al. |
| 2008/0037196 A1 | 2/2008 | Yonekura et al. |
| 2008/0048498 A1 | 2/2008 | Wiedemuth et al. |
| 2008/0106842 A1 | 5/2008 | Ito et al. |
| 2008/0135401 A1 | 6/2008 | Kadlec et al. |
| 2008/0160212 A1 | 7/2008 | Koo et al. |
| 2008/0185537 A1 | 8/2008 | Walther et al. |
| 2008/0210545 A1 | 9/2008 | Kouznetsov |
| 2008/0236493 A1 | 10/2008 | Sakao |
| 2008/0252225 A1 | 10/2008 | Kurachi et al. |
| 2008/0272706 A1 | 11/2008 | Kwon et al. |
| 2008/0289576 A1 | 11/2008 | Lee et al. |
| 2009/0016549 A1 | 1/2009 | French et al. |
| 2009/0059462 A1 | 3/2009 | Mizuno et al. |
| 2009/0078678 A1 | 3/2009 | Kojima et al. |
| 2009/0133839 A1 | 5/2009 | Yamazawa et al. |
| 2009/0236214 A1 | 9/2009 | Janakiraman et al. |
| 2009/0295295 A1 | 12/2009 | Shannon et al. |
| 2010/0018648 A1 | 1/2010 | Collins et al. |
| 2010/0025230 A1 | 2/2010 | Ehiasarian et al. |
| 2010/0029038 A1 | 2/2010 | Murakawa |
| 2010/0072172 A1 | 3/2010 | Ui et al. |
| 2010/0101935 A1 | 4/2010 | Chistyakov et al. |
| 2010/0118464 A1 | 5/2010 | Matsuyama |
| 2010/0154994 A1 | 6/2010 | Fischer et al. |
| 2010/0193491 A1 | 8/2010 | Cho et al. |
| 2010/0271744 A1 | 10/2010 | Ni et al. |
| 2010/0276273 A1 | 11/2010 | Heckman et al. |
| 2010/0321047 A1 | 12/2010 | Zollner et al. |
| 2010/0326957 A1 | 12/2010 | Maeda et al. |
| 2011/0096461 A1 | 4/2011 | Yoshikawa et al. |
| 2011/0100807 A1 | 5/2011 | Matsubara et al. |
| 2011/0143537 A1 | 6/2011 | Lee et al. |
| 2011/0157760 A1 | 6/2011 | Willwerth et al. |
| 2011/0177669 A1 | 7/2011 | Lee et al. |
| 2011/0177694 A1 | 7/2011 | Chen et al. |
| 2011/0259851 A1 | 10/2011 | Brouk et al. |
| 2011/0281438 A1 | 11/2011 | Lee et al. |
| 2011/0298376 A1 | 12/2011 | Kanegae et al. |
| 2012/0000421 A1 | 1/2012 | Miller et al. |
| 2012/0052599 A1 | 3/2012 | Brouk et al. |
| 2012/0081350 A1 | 4/2012 | Sano et al. |
| 2012/0088371 A1 | 4/2012 | Ranjan et al. |
| 2012/0097908 A1 | 4/2012 | Willwerth et al. |
| 2012/0171390 A1 | 7/2012 | Nauman et al. |
| 2012/0319584 A1 | 12/2012 | Brouk et al. |
| 2013/0059448 A1 | 3/2013 | Marakhtanov et al. |
| 2013/0087447 A1 | 4/2013 | Bodke et al. |
| 2013/0175575 A1 | 7/2013 | Ziemba et al. |
| 2013/0213935 A1 | 8/2013 | Liao et al. |
| 2013/0214828 A1 | 8/2013 | Valcore, Jr. et al. |
| 2013/0340938 A1 | 12/2013 | Tappan et al. |
| 2013/0344702 A1 | 12/2013 | Nishizuka |
| 2014/0057447 A1 | 2/2014 | Yang et al. |
| 2014/0061156 A1 | 3/2014 | Brouk et al. |
| 2014/0062495 A1 | 3/2014 | Carter et al. |
| 2014/0077611 A1 | 3/2014 | Young et al. |
| 2014/0109886 A1 | 4/2014 | Singleton et al. |
| 2014/0117861 A1 | 5/2014 | Finley et al. |
| 2014/0125315 A1 | 5/2014 | Kirchmeier et al. |
| 2014/0154819 A1 | 6/2014 | Gaff et al. |
| 2014/0177123 A1 | 6/2014 | Thach et al. |
| 2014/0238844 A1 | 8/2014 | Chistyakov |
| 2014/0262755 A1 | 9/2014 | Deshmukh et al. |
| 2014/0263182 A1 | 9/2014 | Chen et al. |
| 2014/0273487 A1 | 9/2014 | Deshmukh et al. |
| 2014/0305905 A1 | 10/2014 | Yamada et al. |
| 2014/0356984 A1 | 12/2014 | Ventzek et al. |
| 2014/0361690 A1 | 12/2014 | Yamada et al. |
| 2015/0002018 A1 | 1/2015 | Lill et al. |
| 2015/0043123 A1 | 2/2015 | Cox |
| 2015/0076112 A1 | 3/2015 | Sriraman et al. |
| 2015/0084509 A1 | 3/2015 | Yuzurihara et al. |
| 2015/0111394 A1 | 4/2015 | Hsu et al. |
| 2015/0116889 A1 | 4/2015 | Yamasaki et al. |
| 2015/0130354 A1 | 5/2015 | Leray et al. |
| 2015/0130525 A1 | 5/2015 | Miller et al. |
| 2015/0170952 A1 | 6/2015 | Subramani et al. |
| 2015/0181683 A1 | 6/2015 | Singh et al. |
| 2015/0235809 A1 | 8/2015 | Ito et al. |
| 2015/0256086 A1 | 9/2015 | Miller et al. |
| 2015/0279689 A1 | 10/2015 | Yamamoto et al. |
| 2015/0303914 A1 | 10/2015 | Ziemba et al. |
| 2015/0315698 A1 | 11/2015 | Chistyakov |
| 2015/0318846 A1 | 11/2015 | Prager et al. |
| 2015/0325413 A1 | 11/2015 | Kim et al. |
| 2015/0366004 A1 | 12/2015 | Nangoy et al. |
| 2016/0004475 A1 | 1/2016 | Beniyama et al. |
| 2016/0020072 A1 | 1/2016 | Brouk et al. |
| 2016/0027678 A1 | 1/2016 | Parkhe et al. |
| 2016/0056017 A1 | 2/2016 | Kim et al. |
| 2016/0064189 A1 | 3/2016 | Tandou et al. |
| 2016/0126069 A1* | 5/2016 | Kwon .................... H05B 31/26 |
| | | 315/111.21 |
| 2016/0196958 A1 | 7/2016 | Leray et al. |
| 2016/0241234 A1 | 8/2016 | Mavretic |
| 2016/0284514 A1 | 9/2016 | Hirano et al. |
| 2016/0314946 A1 | 10/2016 | Pelleymounter |
| 2016/0322242 A1 | 11/2016 | Nguyen et al. |
| 2016/0327029 A1 | 11/2016 | Ziemba et al. |
| 2016/0351375 A1 | 12/2016 | Valcore, Jr. et al. |
| 2016/0358755 A1 | 12/2016 | Long et al. |
| 2017/0011887 A1 | 1/2017 | Deshmukh et al. |
| 2017/0018411 A1 | 1/2017 | Sriraman et al. |
| 2017/0022604 A1 | 1/2017 | Christie et al. |
| 2017/0029937 A1 | 2/2017 | Chistyakov et al. |
| 2017/0069462 A1 | 3/2017 | Kanarik et al. |
| 2017/0076962 A1 | 3/2017 | Engelhardt |
| 2017/0098527 A1 | 4/2017 | Kawasaki et al. |
| 2017/0098549 A1 | 4/2017 | Agarwal |
| 2017/0110335 A1 | 4/2017 | Yang et al. |
| 2017/0110358 A1 | 4/2017 | Sadjadi et al. |
| 2017/0113355 A1 | 4/2017 | Genetti et al. |
| 2017/0115657 A1 | 4/2017 | Trussell et al. |
| 2017/0117172 A1 | 4/2017 | Genetti et al. |
| 2017/0154726 A1 | 6/2017 | Prager et al. |
| 2017/0162417 A1 | 6/2017 | Ye et al. |
| 2017/0163254 A1 | 6/2017 | Ziemba et al. |
| 2017/0169996 A1 | 6/2017 | Ul et al. |
| 2017/0170449 A1 | 6/2017 | Alexander et al. |
| 2017/0178917 A1 | 6/2017 | Kamp et al. |
| 2017/0221682 A1 | 8/2017 | Nishimura et al. |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0243731 A1 | 8/2017 | Ziemba et al. |
| 2017/0250056 A1 | 8/2017 | Boswell et al. |
| 2017/0263478 A1 | 9/2017 | McChesney et al. |
| 2017/0278665 A1 | 9/2017 | Carter et al. |
| 2017/0287791 A1 | 10/2017 | Coppa et al. |
| 2017/0311431 A1 | 10/2017 | Park |
| 2017/0316935 A1 | 11/2017 | Tan et al. |
| 2017/0330734 A1 | 11/2017 | Lee et al. |
| 2017/0330786 A1 | 11/2017 | Genetti et al. |
| 2017/0334074 A1 | 11/2017 | Genetti et al. |
| 2017/0358431 A1 | 12/2017 | Dorf et al. |
| 2017/0365445 A1* | 12/2017 | Kubota ............... H01J 37/3299 |
| 2017/0366173 A1 | 12/2017 | Miller et al. |
| 2017/0372912 A1 | 12/2017 | Long et al. |
| 2018/0019100 A1 | 1/2018 | Brouk et al. |
| 2018/0076032 A1 | 3/2018 | Wang et al. |
| 2018/0102769 A1 | 4/2018 | Prager et al. |
| 2018/0139834 A1 | 5/2018 | Nagashima et al. |
| 2018/0166249 A1 | 6/2018 | Dorf et al. |
| 2018/0189524 A1 | 7/2018 | Miller et al. |
| 2018/0190501 A1 | 7/2018 | Ueda |

(56) References Cited

U.S. PATENT DOCUMENTS

| | | | |
|---|---|---|---|
| 2018/0204708 A1 | 7/2018 | Tan et al. | |
| 2018/0205369 A1 | 7/2018 | Prager et al. | |
| 2018/0218905 A1 | 8/2018 | Park et al. | |
| 2018/0226225 A1 | 8/2018 | Koh et al. | |
| 2018/0226896 A1 | 8/2018 | Miller et al. | |
| 2018/0253570 A1 | 9/2018 | Miller et al. | |
| 2018/0261430 A1* | 9/2018 | Kawasaki | H01J 37/32935 |
| 2018/0286636 A1 | 10/2018 | Ziemba et al. | |
| 2018/0294566 A1 | 10/2018 | Wang et al. | |
| 2018/0309423 A1 | 10/2018 | Okunishi et al. | |
| 2018/0331655 A1 | 11/2018 | Prager et al. | |
| 2018/0350649 A1 | 12/2018 | Gomm | |
| 2018/0366305 A1 | 12/2018 | Nagami et al. | |
| 2018/0374672 A1 | 12/2018 | Hayashi et al. | |
| 2019/0027344 A1 | 1/2019 | Okunishi et al. | |
| 2019/0057845 A1* | 2/2019 | Nagami | H01J 37/32183 |
| 2019/0080884 A1 | 3/2019 | Ziemba et al. | |
| 2019/0090338 A1 | 3/2019 | Koh et al. | |
| 2019/0096633 A1 | 3/2019 | Pankratz et al. | |
| 2019/0157041 A1 | 5/2019 | Zyl et al. | |
| 2019/0157042 A1 | 5/2019 | Van Zyl et al. | |
| 2019/0157044 A1 | 5/2019 | Ziemba et al. | |
| 2019/0172685 A1 | 6/2019 | Van Zyl et al. | |
| 2019/0172688 A1 | 6/2019 | Ueda | |
| 2019/0180982 A1 | 6/2019 | Brouk et al. | |
| 2019/0198333 A1 | 6/2019 | Tokashiki | |
| 2019/0237218 A1 | 8/2019 | Heyne et al. | |
| 2019/0237300 A1 | 8/2019 | Ikeda et al. | |
| 2019/0259562 A1 | 8/2019 | Dorf et al. | |
| 2019/0277804 A1 | 9/2019 | Prager et al. | |
| 2019/0295769 A1 | 9/2019 | Prager et al. | |
| 2019/0295819 A1 | 9/2019 | Okunishi et al. | |
| 2019/0318918 A1 | 10/2019 | Saitoh et al. | |
| 2019/0333741 A1 | 10/2019 | Nagami et al. | |
| 2019/0341232 A1 | 11/2019 | Thokachichu et al. | |
| 2019/0348258 A1 | 11/2019 | Koh et al. | |
| 2019/0348263 A1 | 11/2019 | Okunishi | |
| 2019/0362941 A1* | 11/2019 | Kawasaki | H01J 37/32935 |
| 2019/0363388 A1 | 11/2019 | Esswein et al. | |
| 2019/0385822 A1 | 12/2019 | Marakhtanov et al. | |
| 2019/0393791 A1 | 12/2019 | Ziemba et al. | |
| 2020/0016109 A1 | 1/2020 | Feng et al. | |
| 2020/0020510 A1 | 1/2020 | Shoeb et al. | |
| 2020/0024330 A1 | 1/2020 | Chan-Hui et al. | |
| 2020/0035457 A1 | 1/2020 | Ziemba et al. | |
| 2020/0035458 A1 | 1/2020 | Ziemba et al. | |
| 2020/0035459 A1 | 1/2020 | Ziemba et al. | |
| 2020/0036367 A1 | 1/2020 | Slobodov et al. | |
| 2020/0037468 A1 | 1/2020 | Ziemba et al. | |
| 2020/0051785 A1 | 2/2020 | Miller et al. | |
| 2020/0051786 A1 | 2/2020 | Ziemba et al. | |
| 2020/0058475 A1 | 2/2020 | Engelstaedter et al. | |
| 2020/0066497 A1 | 2/2020 | Engelstaedter et al. | |
| 2020/0066498 A1 | 2/2020 | Engelstaedter et al. | |
| 2020/0075290 A1* | 3/2020 | Kawasaki | H01J 37/32146 |
| 2020/0075293 A1 | 3/2020 | Ventzek et al. | |
| 2020/0090905 A1 | 3/2020 | Brouk et al. | |
| 2020/0106137 A1 | 4/2020 | Murphy et al. | |
| 2020/0126760 A1 | 4/2020 | Ziemba et al. | |
| 2020/0126837 A1 | 4/2020 | Kuno et al. | |
| 2020/0144030 A1 | 5/2020 | Prager et al. | |
| 2020/0161091 A1 | 5/2020 | Ziemba et al. | |
| 2020/0161098 A1 | 5/2020 | Cui et al. | |
| 2020/0161155 A1 | 5/2020 | Rogers et al. | |
| 2020/0162061 A1 | 5/2020 | Prager et al. | |
| 2020/0168436 A1 | 5/2020 | Ziemba et al. | |
| 2020/0168437 A1 | 5/2020 | Ziemba et al. | |
| 2020/0176221 A1 | 6/2020 | Prager et al. | |
| 2020/0227230 A1 | 7/2020 | Ziemba et al. | |
| 2020/0227289 A1 | 7/2020 | Song et al. | |
| 2020/0234922 A1 | 7/2020 | Dorf et al. | |
| 2020/0234923 A1 | 7/2020 | Dorf et al. | |
| 2020/0243303 A1 | 7/2020 | Mishra et al. | |
| 2020/0251371 A1 | 8/2020 | Kuno et al. | |
| 2020/0266022 A1 | 8/2020 | Dorf et al. | |
| 2020/0266035 A1 | 8/2020 | Nagaiwa | |
| 2020/0294770 A1 | 9/2020 | Kubota | |
| 2020/0328739 A1 | 10/2020 | Miller et al. | |
| 2020/0352017 A1 | 11/2020 | Dorf et al. | |
| 2020/0357607 A1 | 11/2020 | Ziemba et al. | |
| 2020/0373114 A1 | 11/2020 | Prager et al. | |
| 2020/0389126 A1 | 12/2020 | Prager et al. | |
| 2020/0407840 A1 | 12/2020 | Hayashi et al. | |
| 2020/0411286 A1 | 12/2020 | Koshimizu et al. | |
| 2021/0005428 A1 | 1/2021 | Shaw et al. | |
| 2021/0013006 A1 | 1/2021 | Nguyen et al. | |
| 2021/0013011 A1 | 1/2021 | Prager et al. | |
| 2021/0013874 A1 | 1/2021 | Miller et al. | |
| 2021/0027990 A1 | 1/2021 | Ziemba et al. | |
| 2021/0029815 A1 | 1/2021 | Bowman et al. | |
| 2021/0043472 A1 | 2/2021 | Koshimizu et al. | |
| 2021/0051792 A1 | 2/2021 | Dokan et al. | |
| 2021/0057188 A1* | 2/2021 | Ni | H03H 7/40 |
| 2021/0066042 A1 | 3/2021 | Ziemba et al. | |
| 2021/0082669 A1 | 3/2021 | Koshiishi et al. | |
| 2021/0091759 A1 | 3/2021 | Prager et al. | |
| 2021/0125812 A1 | 4/2021 | Ziemba et al. | |
| 2021/0130955 A1 | 5/2021 | Nagaike et al. | |
| 2021/0138257 A1* | 5/2021 | Dolgoff | A61B 5/055 |
| 2021/0140044 A1 | 5/2021 | Nagaike et al. | |
| 2021/0151295 A1 | 5/2021 | Ziemba et al. | |
| 2021/0152163 A1 | 5/2021 | Miller et al. | |
| 2021/0210313 A1 | 7/2021 | Ziemba et al. | |
| 2021/0210315 A1 | 7/2021 | Ziemba et al. | |
| 2021/0225614 A1* | 7/2021 | De Chambirier | H01J 37/32935 |
| 2021/0249227 A1 | 8/2021 | Bowman et al. | |
| 2021/0272775 A1 | 9/2021 | Koshimizu | |
| 2021/0288582 A1 | 9/2021 | Ziemba et al. | |
| 2021/0327681 A1* | 10/2021 | Koshimizu | H01J 37/32128 |
| 2022/0037119 A1* | 2/2022 | Dorf | H01J 37/32146 |
| 2022/0037120 A1* | 2/2022 | Dorf | H01L 21/31116 |
| 2022/0037121 A1* | 2/2022 | Dorf | H01J 37/32128 |
| 2022/0399186 A1* | 12/2022 | Cui | H01L 21/6833 |
| 2022/0399193 A1* | 12/2022 | Cui | H01J 37/32146 |
| 2023/0030927 A1* | 2/2023 | Dorf | H01J 37/32183 |
| 2023/0178336 A1* | 6/2023 | Rogers | H01J 37/32577 |
| | | | 438/714 |
| 2023/0207265 A1* | 6/2023 | Arakelyan | H01J 37/3244 |
| | | | 156/345.28 |
| 2023/0298856 A1* | 9/2023 | Rogers | H01J 37/32137 |
| | | | 438/714 |
| 2023/0326717 A1* | 10/2023 | Dorf | H01J 37/32128 |
| | | | 323/371 |
| 2023/0377843 A1* | 11/2023 | Koshimizu | H01L 21/3065 |
| 2024/0030002 A1* | 1/2024 | Dorf | H01J 37/32577 |
| 2024/0145215 A1* | 5/2024 | Dash | H01J 37/32128 |
| 2024/0162007 A1* | 5/2024 | Li | H01J 37/32091 |
| 2024/0194447 A1* | 6/2024 | Guo | H01J 37/32091 |
| 2025/0191884 A1* | 6/2025 | Dash | H01J 37/32935 |

FOREIGN PATENT DOCUMENTS

| | | |
|---|---|---|
| CN | 101707186 B | 2/2012 |
| CN | 104752134 A | 7/2015 |
| CN | 105408993 A | 3/2016 |
| CN | 106206234 A | 12/2016 |
| EA | 1691481 A1 | 8/2006 |
| EP | 665306 A1 | 8/1995 |
| EP | 983394 A1 | 3/2000 |
| EP | 1119033 A1 | 7/2001 |
| EP | 1203441 A1 | 5/2002 |
| EP | 1214459 A1 | 6/2002 |
| EP | 1418670 A1 | 5/2004 |
| EP | 1701376 A1 | 9/2006 |
| EP | 1708239 A1 | 10/2006 |
| EP | 1780777 A1 | 5/2007 |
| EP | 1852959 A1 | 11/2007 |
| EP | 2016610 A1 | 1/2009 |
| EP | 2096679 A1 | 9/2009 |
| EP | 2221614 A1 | 8/2010 |
| EP | 2541584 A1 | 1/2013 |
| EP | 2580368 A1 | 4/2013 |
| EP | 2612544 A1 | 7/2013 |

(56)     References Cited

FOREIGN PATENT DOCUMENTS

| EP | 2838112 | A1 | 2/2015 |
| EP | 2991103 | A1 | 3/2016 |
| EP | 3086359 | A1 | 10/2016 |
| EP | 3396700 | A1 | 10/2018 |
| EP | 3616234 | A1 | 3/2020 |
| JP | H08236602 | A | 9/1996 |
| JP | 2748213 | B2 | 5/1998 |
| JP | H11025894 | A | 1/1999 |
| JP | 2002299322 | A | 10/2002 |
| JP | 2002313899 | A | 10/2002 |
| JP | 4418424 | B2 | 2/2010 |
| JP | 2011035266 | A | 2/2011 |
| JP | 5018244 | B2 | 9/2012 |
| JP | 2014112644 | A | 6/2014 |
| JP | 2016225439 | A | 12/2016 |
| JP | 6741461 | B2 | 8/2020 |
| KR | 100757347 | B1 | 9/2007 |
| KR | 20070098556 | A | 10/2007 |
| KR | 20160042429 | A | 4/2016 |
| KR | 20200036947 | A | 4/2020 |
| KR | 20200086751 | A | 7/2020 |
| KR | 20220158660 | A | 12/2022 |
| TW | 498706 | B | 8/2002 |
| TW | 201717247 | A | 5/2017 |
| WO | 1998053116 | A1 | 11/1998 |
| WO | 2000017920 | A1 | 3/2000 |
| WO | 2000030147 | A1 | 5/2000 |
| WO | 2000063459 | A1 | 10/2000 |
| WO | 2001005020 | A1 | 1/2001 |
| WO | 2001012873 | A1 | 2/2001 |
| WO | 2001013402 | A1 | 2/2001 |
| WO | 2002052628 | A1 | 7/2002 |
| WO | 2002054835 | A2 | 7/2002 |
| WO | 2002059954 | A1 | 8/2002 |
| WO | 2003037497 | A2 | 5/2003 |
| WO | 2003052882 | A2 | 6/2003 |
| WO | 2003054911 | A2 | 7/2003 |
| WO | 2003077414 | A2 | 9/2003 |
| WO | 2004084394 | A1 | 9/2004 |
| WO | 2005124844 | A1 | 12/2005 |
| WO | 2007118042 | A2 | 10/2007 |
| WO | 2008016747 | A2 | 2/2008 |
| WO | 2008050619 | A1 | 5/2008 |
| WO | 2008061775 | A1 | 5/2008 |
| WO | 2008061784 | A1 | 5/2008 |
| WO | 2008062663 | A1 | 5/2008 |
| WO | 2009012804 | A1 | 1/2009 |
| WO | 2009069670 | A1 | 6/2009 |
| WO | 2009111473 | A2 | 9/2009 |
| WO | 2011073093 | A1 | 6/2011 |
| WO | 2011087984 | A2 | 7/2011 |
| WO | 2011156055 | A1 | 12/2011 |
| WO | 2012030500 | A1 | 3/2012 |
| WO | 2012109159 | A1 | 8/2012 |
| WO | 2012122064 | A1 | 9/2012 |
| WO | 2013000918 | A1 | 1/2013 |
| WO | 2013016619 | A1 | 1/2013 |
| WO | 2013084459 | A1 | 6/2013 |
| WO | 2013088677 | A1 | 6/2013 |
| WO | 2013099133 | A1 | 7/2013 |
| WO | 2013114882 | A1 | 8/2013 |
| WO | 2013118660 | A1 | 8/2013 |
| WO | 2013125523 | A1 | 8/2013 |
| WO | 2013187218 | A1 | 12/2013 |
| WO | 2014035889 | A1 | 3/2014 |
| WO | 2014035894 | A1 | 3/2014 |
| WO | 2014035897 | A1 | 3/2014 |
| WO | 2014036000 | A1 | 3/2014 |
| WO | 2014124857 | A2 | 8/2014 |
| WO | 2014197145 | A1 | 12/2014 |
| WO | 2017208807 | A1 | 12/2014 |
| WO | 2015060185 | A1 | 4/2015 |
| WO | 2014124857 | A3 | 5/2015 |
| WO | 2015134398 | A1 | 9/2015 |
| WO | 2015198854 | A1 | 12/2015 |
| WO | 2016002547 | A1 | 1/2016 |
| WO | 2016060058 | A1 | 4/2016 |
| WO | 2016060063 | A1 | 4/2016 |
| WO | 2015073921 | A8 | 5/2016 |
| WO | 2016104098 | A1 | 6/2016 |
| WO | 2016128384 | A1 | 8/2016 |
| WO | 2016131061 | A1 | 8/2016 |
| WO | 2016170989 | A1 | 10/2016 |
| WO | 2017172536 | A1 | 10/2017 |
| WO | 2018048925 | A1 | 3/2018 |
| WO | 2018111751 | A1 | 6/2018 |
| WO | 2018170010 | A1 | 9/2018 |
| WO | 2018197702 | A1 | 11/2018 |
| WO | 2019036587 | A1 | 2/2019 |
| WO | 2019040949 | A1 | 2/2019 |
| WO | 2019099870 | A1 | 5/2019 |
| WO | 2019185423 | A1 | 10/2019 |
| WO | 2019225184 | A1 | 11/2019 |
| WO | 2019239872 | A1 | 12/2019 |
| WO | 2019244697 | A1 | 12/2019 |
| WO | 2019244698 | A1 | 12/2019 |
| WO | 2019244734 | A1 | 12/2019 |
| WO | 2019245729 | A1 | 12/2019 |
| WO | 2020004048 | A1 | 1/2020 |
| WO | 2020017328 | A1 | 1/2020 |
| WO | 2020022318 | A1 | 1/2020 |
| WO | 2020022319 | A1 | 1/2020 |
| WO | 2020026802 | A1 | 2/2020 |
| WO | 2020036806 | A1 | 2/2020 |
| WO | 2020037331 | A1 | 2/2020 |
| WO | 2020046561 | A1 | 3/2020 |
| WO | 2020051064 | A1 | 3/2020 |
| WO | 2020112921 | A1 | 6/2020 |
| WO | 2020121819 | A1 | 6/2020 |
| WO | 2020145051 | A1 | 7/2020 |
| WO | 2021003319 | A1 | 1/2021 |
| WO | 2016059207 | A1 | 4/2021 |
| WO | 2021062223 | A1 | 4/2021 |
| WO | 2021097459 | A1 | 5/2021 |
| WO | 2021134000 | A1 | 7/2021 |
| WO | 2022026127 | A1 | 2/2022 |
| WO | 2022265838 | A1 | 12/2022 |
| WO | 2019099102 | A1 | 5/2024 |

OTHER PUBLICATIONS

Dr. Steve Sirard, "Introduction to Plasma Etching", Lam Research Corporation. 64 pages.

Eagle Harbor Technologies presentation by Dr. Kenneth E. Miller—"The EHT Long Pulse Integrator Program," ITPA Diagnostic Meeting, General Atomics, Jun. 4-7, 2013, 18 pages.

Michael A. Lieberman, "A short course of the principles of plasma discharges and materials processing", Department of Electrical Engineering and Computer Sciences University of California, Berkeley, CA 94720.

Michael A. Lieberman, "Principles of Plasma Discharges and Material Processing", A Wiley Interscience Publication. 1994.

Kamada, Keiichi, et al., Editors—"New Developments of Plasma Science with Pulsed Power Technology," Research Report, NIFS-PROC-82, presented at National Institute for Fusion Science, Toki, Gifu, Japan, Mar. 5-6, 2009, 109 pages.

Yiting Zhang et al. "Investigation of feature orientation and consequences of ion tilting during plasma etching with a three-dimensional feature profile simulator", Nov. 22, 2016.

Chang, Bingdong, "Oblique angled plasma etching for 30 silicon structures with wiggling geometries" 31(8), [085301]. hittps://doi.org/10.1088/1361-6528/ab53fb. DTU Library. 2019.

Semiconductor Components Industries, LLC (SCILLC)—"Switch-Mode Power Supply" Reference Manual, SMPSRM/D, Rev. 4, Apr. 2014, ON Semiconductor, 73 pages.

Wikipedia, "Radio frequency" via https://en.wikipedia.org/wiki/Radio_frequency; pp. 1-4 (Year: 2023).

Azo Materials "Alumina-Aluminum Oxide-Al2O3—A Refractory Ceramic Oxide" via https://www.azom.com/properties.aspx?Articlel D=52 ; pp. 1-2; (Year: 2023).

(56)          References Cited

OTHER PUBLICATIONS

Azo Materials "Aluminium Nitride/ Aluminum Nitride (AIN)—Properties and Applications" via https://www.azom.com/properties.aspx ?Article I 0=610 (Year: 2023).
Irhe International Search Report and the Written Opinion for International Application No. PCT/US2021/040380; dated Oct. 27, 2021; 10 pages.
PCT International Search Report and Written Opinion dated Nov. 9, 2018, for International Application No. PCT/US2018/043032.
Taiwan Office Action for Application No. 107125613 dated Dec. 24, 2020, 16 pages.
PCT International Search Report and Written Opinion dated Nov. 7, 2018, for International Application No. PCT/US2018/042965.
International Search Report and Written Opinion for PCT/US2019/052067 dated Jan. 21, 2020.
PCT Notification of Transmittal of the International Search Report and the Written Opinion of the International Searching Authority for International Application No. PCT/US2019/048392; dated Dec. 16, 2019; 13 pages.
PCT International Search Report and Written Opinion dated Nov. 7, 2018, for International Application No. PCT/US2018/042961.
PCT International Search Report and Written Opinion dated Nov. 7, 2018, for International Application No. PCT/US2018/042956.
U.S. Appl. No. 62/433,204; entitled Creating Arbitrarily-Shaped Ion Energy Distribution Function {IEDF} Using Shaped-Pulse (EV) Bias; by Leonid Dorf, et al.; filed Dec. 16, 2016; 22 total pages.
U.S. Appl. No. 15/424,405; entitled System for Tunable Workpiece Biasing in a Plasma Reactor; by Travis Koh, et al.; filed Feb. 3, 2017; 29 total pages.
U.S. Appl. No. 15/618,082; entitled Systems and Methods for Controlling a Voltage Waveform at a Substrate During Plasma Processing; by Leonid Dorf, et al.; filed Jun. 8, 2017; 35 total pages.
PCT Notification of Transmittal of the International Search Report and the Written Opinion of the International Searching Authority for International Application No. PCT/US2018/046171; dated Nov. 28, 2018; 10 total pages.
PCT Notification of Transmittal of the International Search Report and the Written Opinion of the International Searching Authority for International Application No. PCT/US2018/046182; dated Nov. 30, 2018; 10 total pages.
PCT/US2020/014453 Interanational Search Report and Written Opinion dated May 14, 2020 consists of 8 pages.
Korean Office Action for 10-2020-7007495 dated Jun. 14, 2021 (Docket No. 025517KR01).
International Search Report and Written Opinion dated Feb. 4, 2022 for Application No. PCT/US2021/054806.
International Search Report and Written Opinion dated Feb. 4, 2022 for Application No. PCT/US2021/054814.
United States Patent Application, U.S. Appl. No. 17/346,103, filed Jun. 11, 2021.
United States Patent Application, U.S. Appl. No. 17/349,763, filed Jun. 16, 2021.
United States Patent Application, U.S. Appl. No. 63/242,410, filed Sep. 9, 2021.
United States Patent Application, U.S. Appl. No. 17/410,803, filed Aug. 24, 2021.
United States Patent Application, U.S. Appl. No. 17/537,107, filed Nov. 29, 2021.
United States Patent Application, U.S. Appl. No. 17/352,165, filed Jun. 18, 2021.
United States Patent Application, U.S. Appl. No. 17/352,176, filed Jun. 18, 2021.

United States Patent Application, U.S. Appl. No. 17/337,146, filed Jun. 2, 2021.
United States Patent Application, U.S. Appl. No. 17/361,178, filed Jun. 28, 2021.
United States Patent Application, U.S. Appl. No. 63/210,956, filed Jun. 15, 2021.
United States Patent Application, U.S. Appl. No. 17/475,223, filed Sep. 14, 2021.
United States Patent Application, U.S. Appl. No. 17/537,314, filed Nov. 29, 2021.
Chinese Office Action for 201880053380.1 dated Dec. 2, 2021 (Docket No. 025517CN01).
Waiwan Office Action for 108132682 dated Mar. 24, 2022.
Wang, S.B., et al.—"Control of ion energy distribution at substrates during plasma processing," Journal of Applied Physics, vol. 88, No. 2, Jul. 15, 2000, pp. 643-646.
Eagle Harbor Technologies presentation by Dr. Kenneth E. Miller—"The EHT Integrated Power Module (IPM): An IGBT-Based, High Current, Ultra-Fast, Modular, Programmable Power Supply Unit," Ju n. 2013, 21 pages.
Zhen-hua Bi et al., A brief review of dual-frequency capacitively coupled discharges, Current Applied Physics, vol. 11, Issue 5, Supplement, 2011, pp. S2-S8.
Eagle Harbor Technologies webpage—"In Situ Testing of EHT Integrators on a Tokamak," 2015, 1 page.
Eagle Harbor Technologies webpage—High Gain and Frequency Ultra-Stable Integrators for Long Pulse and/or High Current Applications, 2018, 1 page.
Eagle Harbor Technologies webpage—"EHT Integrator Demonstration at D111-D," 2015, 1 page.
Eagle Harbor Technologies webpage—"High Gain and Frequency Ultra-Stable Integrators for ICC and Long Pulse ITER Applications," 2012, 1 page.
Eagle Harbor Technologies webpage—"Long-Pulse Integrator Testing with D111-D Magnetic Diagnostics," 2016, 1 page.
Sunstone Circuits—"Eagle Harbor Tech Case Study," date unknown, 4 pages.
Prager, J.R., et al.—"A High Voltage Nanosecond Pulser with Variable Pulse Width and Pulse Repetition Frequency Control for Nonequilibrium Plasma Applications," IEEE 41st International Conference on Plasma Sciences {ICOPS} held with 2014 IEEE International Conference on High-Power Particle Beams (BEAMS), pp. 1-6, 2014.
Zhuoxing Luo, B_S_, M.S, "RF Plasma Etching With A DC Bias" A Dissertation in Physics_ Dec. 1994.
Lin, Jianliang, et al.,—"Diamond like carbon films deposited by HiPIMS using oscillatory voltage pulses," Surface & Coatings Technology 258, 2014, published by Elsevier BY, pp. 1212-1222.
Richard Barnett et al. A New Plasma Source for Next Generation MEMS Deep Si Etching: Minimal Tilt, Improved Profile Uniformity and Higher Etch Rates, SPP Process Technology Systems. 2010.
S.B. Wang et al. "Ion Bombardment Energy and SiO 2/Si Fluorocarbon Plasma Etch Selectivity", Journal of Vacuum Science & Technology A 19, 2425 (2001).
Electrical 4 U webpage—"Clamping Circuit," Aug. 29, 2018, 1 page.
Kyung Chae Yang et al., A study on the etching characteristics of magnetic tunneling junction materials using DC pulse-biased inductively coupled plasmas, Japanese Journal of Applied Physics, vol. 54, 01AE01, Oct. 29, 2014, 6 pages.

* cited by examiner

300

302

DELIVER A RADIO FREQUENCY (RF)
WAVEFORM AT A FREQUENCY FOR A FIRST
PERIOD OF TIME USING A RF GENERATOR
AND THEN HALT THE DELIVERY OF THE RF
WAVEFORM FOR A SECOND PERIOD OF TIME

304

DELIVER A PULSED VOLTAGE WAVEFORM AT
A FIRST VOLTAGE USING A PULSER

PULSED VOLTAGE WAVEFORM BIASING OF PLASMA

BACKGROUND

Field

Embodiments described herein generally relate to a system and methods used in semiconductor device fabrication. More specifically, embodiments of the present disclosure relate to a plasma processing system used to process a substrate.

Description of the Related Art

Reliably producing high aspect ratio features is one of the key technology challenges for the next generation of semiconductor devices. One method of forming high aspect ratio features uses a plasma assisted etching process, such as a reactive ion etch (RIE) plasma process, to form high aspect ratio openings in a material layer, such as a dielectric layer, of a substrate. In a typical RIE plasma process, a plasma is formed in a processing chamber and ions from the plasma are accelerated towards a surface of a substrate to form openings in a material layer disposed beneath a mask layer formed on the surface of the substrate.

With technology nodes advancing towards 2 nanometers (nm), the fabrication of smaller features with larger aspect ratios requires atomic precision for plasma processing. For etching processes where the plasma ions play a major role, ion energy control is always challenging the development of reliable and repeatable device formation processes in the semiconductor equipment industry. In a typical plasma-assisted etching process, the substrate is positioned on a substrate support disposed in a processing chamber, a plasma is formed over the substrate by use of a radio frequency (RF) generator that is coupled to an electrode disposed on or within the plasma processing chamber, and ions are accelerated from the plasma towards the substrate across a plasma sheath. Additionally, RF substrate biasing methods, which require the use of a separate RF biasing source in addition to the RF generator that is used to initiate and maintain the plasma in the processing chamber, have been unable to desirably control the plasma sheath properties to achieve desirable plasma processing results that will allow the formation of these smaller device feature sizes. The traditional RF generator and RF biasing methods utilize sinusoidal RF waveforms to excite the plasma and form the plasma sheath often leads to undesirable and inconsistent process results due to sinusoidal shape of the RF waveform and the inability of the RF biasing methods to adjust the ion energy during processing due to limitations in the provided sinusoidal waveform characteristics.

Accordingly, there is a need in the art for a desirable plasma-assisted process that solves the problems described above.

SUMMARY

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

Embodiments of the present disclosure provide a method for waveform generation. The method generally includes delivering a radio frequency (RF) waveform at a frequency for a first period of time using a RF generator and then halting the delivery of the RF waveform for a second period of time, and delivering a pulsed voltage waveform at a first voltage for at least a portion of a third period of time using a pulser, wherein the delivery of the pulsed voltage waveform overlaps with the delivery of the RF waveform during a portion of the second period of time.

Embodiments of the present disclosure provide a waveform generator. The waveform generator generally includes a system controller coupled to the waveform generator. The system controller generally includes memory that includes computer-executable instructions and one or more processors configured to execute the computer-executable instructions and cause the waveform generator to deliver a radio frequency (RF) waveform at a frequency for a first period of time using a RF generator and then halting the delivery of the RF waveform for a second period of time, and deliver a pulsed voltage waveform at a first voltage for at least a portion of a third period of time using a pulser, wherein the delivery of the pulsed voltage waveform overlaps with the delivery of the RF waveform during a portion of the second period of time.

BRIEF DESCRIPTION OF THE DRAWINGS

So that the manner in which the above recited features of embodiments of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure generally relate to apparatus and methods for performing plasma-assisted processes. More specifically, embodiments provided herein provide for controlling a plasma during processing by controlling the delivery of a pulsed radio frequency (RF) waveform and a pulsed voltage (PV) waveform. In some embodiments, the process of controlling the plasma includes controlling an overlap in time between a pulse of the pulsed RF waveform and a series of pulses included within the PV waveform. It has been found that by controlling the delivery and overlap in time of pulses of a pulsed RF waveform and a series of bursts of voltage pulses within a PV waveform can be used to improve the plasma processing results on a substrate during plasma processing. In one example, it has been found that by controlling the process parameters of the PV waveform during one or more bursts of voltage pulses, the plasma properties can be controlled to achieve improved processing results, such as improved narrow aspect-ratio etch results and better profile control on a substrate during plasma processing. In general, a burst of voltage pulses within a PV waveform will include a series of voltage pulse that can be provided to an electrode within a plasma processing chamber. An example of the process parameters of the PV waveform can include the PV on-time, the PV pulse duty cycle, the pulsing frequency, PV pulse burst length, and the voltage set-point of the PV waveform. These process parameters may be manipulated as desired to provide enhanced control of the plasma-assisted processes when compared to conventional plasma-assisted processes that only utilize the delivery of an RF waveform or a pulsed RF waveform to control the plasma during processing.

Processing System Examples

Figure 1:
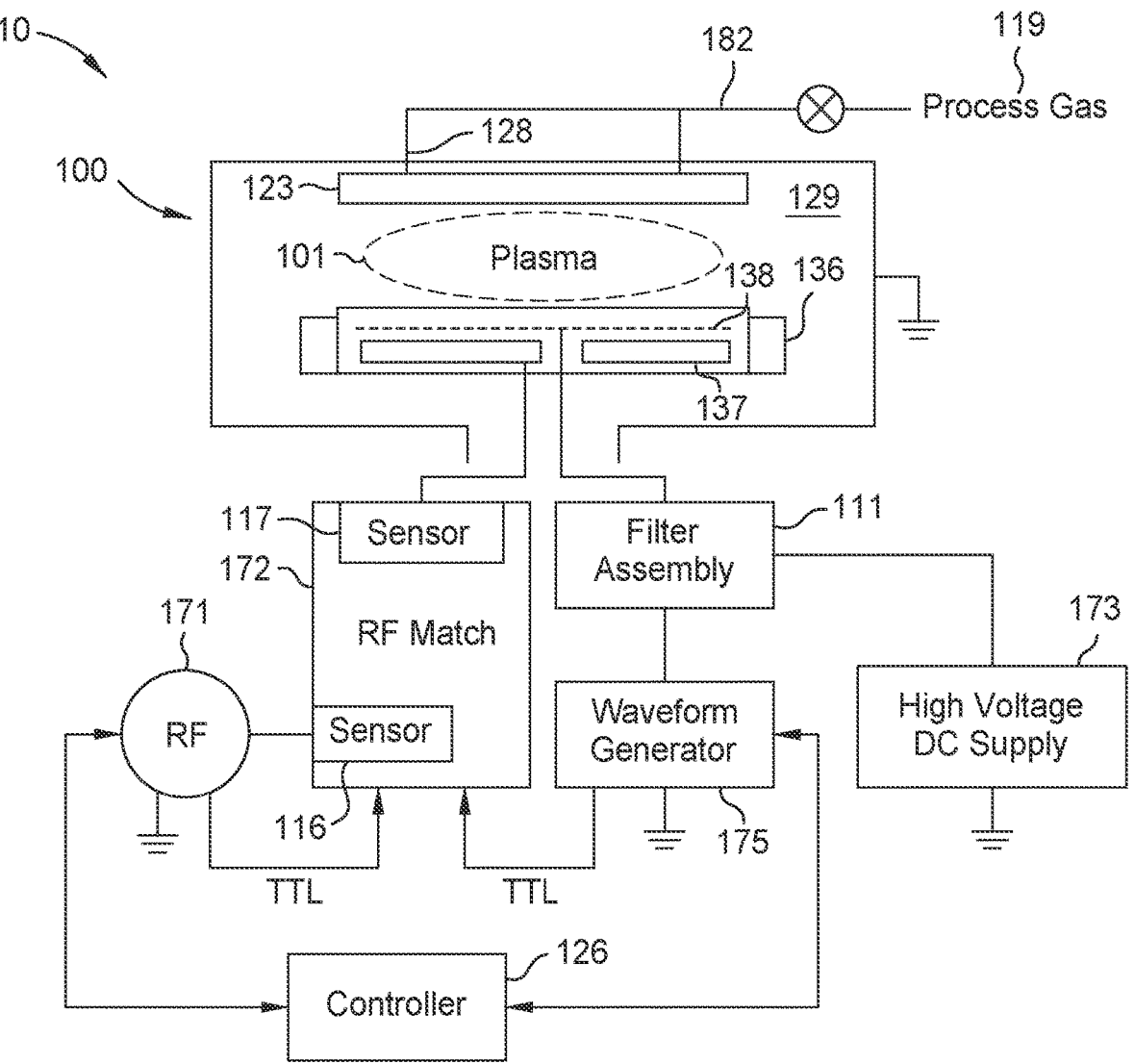
FIG. 1 is a schematic representation of an example processing system, in which embodiments of the present disclosure may be implemented.

FIG. 1 is a schematic representation of an example processing system 10. The plasma processing system 10 is configured for plasma-assisted etching processes, such as a reactive ion etch (RIE) plasma processing. The plasma processing system 10 can also be used in other plasma-assisted processes, such as plasma-enhanced deposition processes (for example, plasma-enhanced chemical vapor deposition (PECVD) processes, plasma-enhanced physical vapor deposition (PEPVD) processes, plasma-enhanced atomic layer deposition (PEALD) processes, plasma treatment processing, plasma-based ion implant processing, or plasma doping (PLAD) processing. In some embodiments, as shown in FIG. 1, the plasma processing system 10 is configured to form a capacitively-coupled-plasma (CCP). In other embodiments, a plasma may alternately be generated by an inductively coupled plasma (ICP) source disposed over a processing region of the plasma processing system 10.

The plasma processing system 10 includes a processing chamber 100, a substrate support assembly 136, a gas delivery system 182, a high voltage direct current (DC) supply 173, a RF generator 171, and an RF match 172 (e.g., RF impedance matching network). A chamber lid 123 includes one or more sidewalls and a chamber base that are configured to withstand the pressures and energy applied to them while a plasma 101 is generated within a vacuum environment maintained in a processing volume 129 of the processing chamber 100 during processing.

The gas delivery system 182, which is coupled to the processing volume 129 of the processing chamber 100 is configured to deliver at least one processing gas from at least one gas processing source 119 to the processing volume 129 of the processing chamber 100. The gas delivery system 182 includes the processing gas source 119 and one or more gas inlets 128 positioned through the chamber lid 123. The gas inlets 128 are configured to deliver one or more processing gasses to the processing volume 129 of the processing chamber 100.

The processing chamber 100 includes a chamber lid 123 and a substrate support assembly 136 positioned in the processing volume 129 of the processing chamber 100. In some embodiments, the chamber lid 123 is grounded and thus acts as an upper electrode during plasma processing. In some embodiments, the RF generator 171 is electrically coupled to a first lower electrode, such as the RF baseplate 137. The RF generator 171 is configured to deliver an RF signal to ignite and maintain the plasma 101 between the upper and lower electrodes. In one example, the RF generator 171 may deliver an RF source power to the RF baseplate 137 within the substrate support assembly 136 (e.g., a cathode assembly) for plasma production. However, in some alternative configurations, the RF generator 171 can be electrically coupled to the upper electrode. A center frequency of the RF source power can be from 13.56 MHz to very high frequency band such as 40 MHZ, 60 MHZ, 120 MHz or 162 MHz. The RF source power can be operated in a continuous mode or a pulsed mode. A pulsing frequency of the RF power can be from 100 to 10 KHz, and duty cycles are ranging from 5% to 95%. The RF generator 171 has a frequency tuning capability and can adjust its RF power frequency within e.g., +5% or +10%. In some embodiments, the RF generator 171 switches the RF power frequency at a predefined speed (e.g., two nanoseconds, fifty nanoseconds, etc.).

The substrate support assembly 136 is coupled to the RF generator 171 configured to deliver an RF signal to the processing volume 129 of the processing chamber 100. The RF generator 171 is electronically coupled to the RF match 172 disposed between the RF generator 171 and the processing volume 129 of the processing chamber 100. For example, the RF match 172 is an electrical circuit used between the RF generator 171 and a plasma reactor (e.g., the processing volume 129 of the processing chamber 100) to optimize power delivery efficiency. One or more RF filters (e.g., within the RF match 172) are designed to only allow powers in a selected frequency range, and to isolate RF power supplies from each other. In some cases, a bandwidth of an RF filter has to be larger than a frequency tuning range of the RF generator 171.

During the plasma processing, the RF generator 171 delivers an RF signal to the RF baseplate 137 of the substrate support assembly 136 via the RF match 172. For example, the RF signal is applied to a load (e.g., gas) in the processing volume 129 of the processing chamber 100. If an impedance of the load is not properly matched to an impedance of a source (e.g., the RF generator 171), a portion of a waveform can reflect back in an opposite direction. Accordingly, to prevent a substantial portion of the waveform from reflecting back, it is necessary to find a match impedance (e.g., a matching point) by adjusting one or more components of the RF match 172 as the source and load impedances change.

The RF match 172 is electrically coupled to the RF generator 171, the substrate support assembly 136, and the PV waveform generator 175. The RF match 172 is configured to receive a synchronization signal from either or both of the RF generator 171 and the PV waveform generator 175.

The substrate support assembly 136 may be coupled to a high voltage DC supply 173 that supplies a chucking voltage thereto. The high voltage DC supply 173 may be coupled to a filter assembly 178 that is disposed between the high voltage DC voltage supply 173 and the substrate support assembly 136. The filter assembly 178 is configured to electronically isolate the high voltage DC supply 173 during plasma processing. In one configuration, a static DC voltage is between about −5000V and about 5000V, and is delivered using an electrical conductor (such as a coaxial power delivery line). The filter assembly 178 may include multiple filtering components or a single common filter.

The substrate support assembly 136 is also coupled to a PV waveform generator 175 configured to supply a PV to an electrode within the substrate support assembly 136 to bias a substrate disposed on the substrate support. The PV waveform generator 175 may be coupled to the RF baseplate 137 or a second electrode disposed within the substrate support assembly 136, such as the chucking electrode 138. The PV waveform generator 175 is coupled to the filter assembly 178, which is coupled to the electrode disposed within the substrate support assembly 136. The filter assembly 178 is disposed between the PV waveform generator 175 and the substrate support assembly 136. The filter assembly 178 is configured to electronically isolate the PV waveform generator 175 from at least the RF signal provided by the RF generator 171 during plasma processing.

The RF generator 171 and the PV waveform generator 175 are each directly coupled to a system controller 126. The system controller 126 synchronizes the respective generated RF signal and PV waveform.

Voltage and current sensors can be placed at an input and/or output of the RF match 172 to measure impedance and other parameters. These sensors can be synchronized using an external transistor-transistor logic (TTL) synchronization signal from an advanced waveform generator and/or RF generators or using measured voltage and current data to determine timing internally. For example, an output sensor 117 is configured to measure the impedance of the plasma processing chamber 100, and other characteristics such as the voltage, current, harmonics, phase, and/or the like. An input sensor 116 is configured to measure the impedance of the RF generator 171 and other characteristics such as the voltage, current, harmonics, phase, and/or the like. Based on either of the synchronization signals or the characteristics of the plasma processing chamber 100, the RF match 172 is able to capture fast impedance changes and optimize impedance matching.

The PV waveform generator 175 is used to supply a PV waveform and/or a tailored voltage waveform, which is a sum of harmonic frequencies associated with the waveform. The PV waveform generator 175 may output a synchronization TTL signal to the RF match 172. The voltage waveform is coupled to a bias electrode (e.g., a bias electrode 104 shown in FIG. 1B) through the filter assembly 178. The high voltage DC supply 173 is applied to chuck a wafer during a process for a thermal control. In some cases, there can be a third electrode at an edge of the cathode assembly for edge uniformity control.

Voltage Waveform Examples

Figure 2:
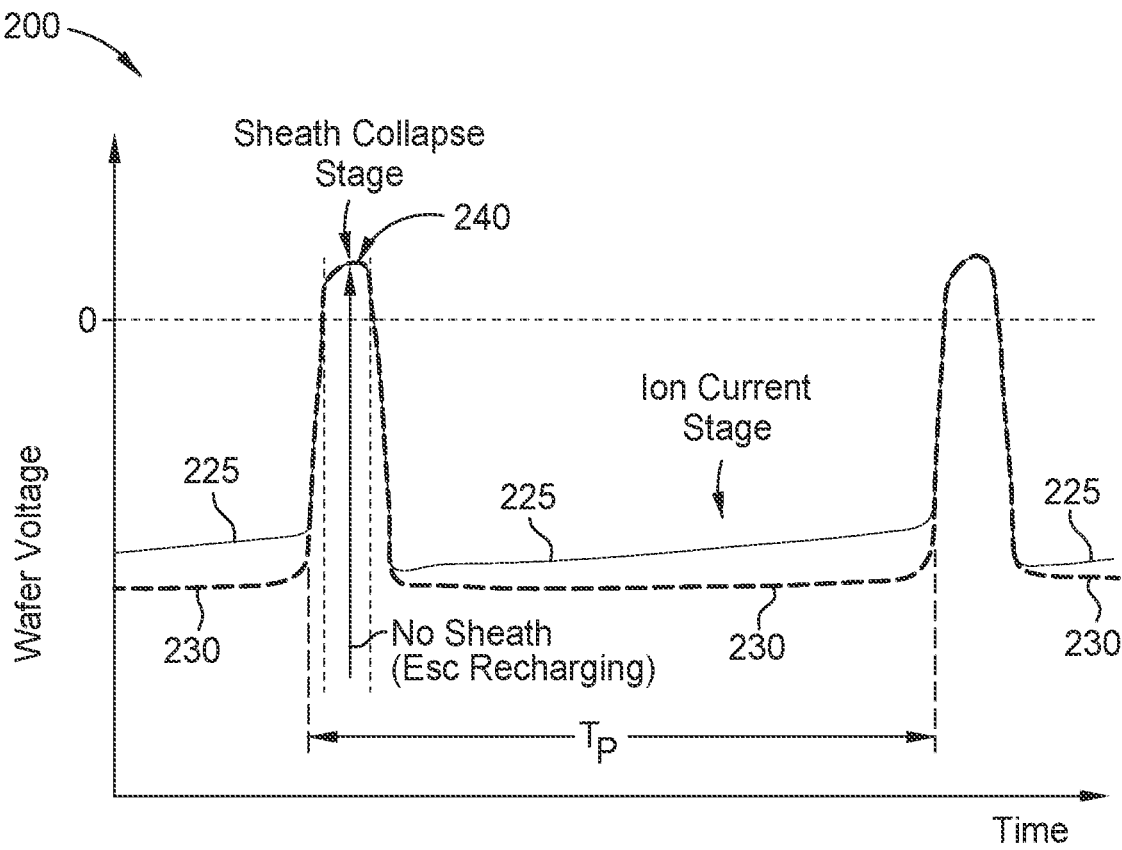
FIG. 2 illustrates a graph of two separate voltage waveforms that are established on a substrate due to a voltage waveform applied to an electrode of a processing chamber, in accordance with certain embodiments of the present disclosure.

FIG. 2 illustrates a graph 200 of two separate voltage waveforms established at the substrate 103 disposed on the substrate receiving surface 105A of the substrate support assembly 136 of the processing chamber 100 due to the delivery of PV waveforms to the bias electrode 104 of the processing chamber 100. A first waveform (e.g., a waveform 225) is an example of a non-compensated PV waveform established at the substrate 103 during the plasma processing. A second waveform (e.g., a waveform 230) is an example of a compensated PV waveform established at the substrate 103 by applying a negative slope waveform to the bias electrode 104 of the processing chamber 100 during an "ion current stage" portion of the PV waveform cycle by use of the current source 177. The compensated PV waveform can alternatively be established by applying a negative voltage ramp during the ion current stage of the PV waveform generated by the PV waveform generator 175. The PV waveform cycle of the waveforms 225, 230 each have a period $T_p$, which is, for example, typically between 2 microsecond ($\mu$s) and 10 $\mu$s, such as 2.5 $\mu$s. The ion current stage of the PV waveform cycle will typically take up between about 50% and about 95% of the period $T_p$, such as from about 80% to about 90% of the period $T_p$.

The waveforms 225 and 230 include two main stages: an ion current stage and a sheath collapse stage. Both portions (e.g., the ion current stage and the sheath collapse stage) of the waveforms 225 and 230, can be alternately and/or separately established at the substrate 103 during the plasma processing. At a beginning of the ion current stage, a drop in the voltage at the substrate 103 is created, due to the delivery of a negative portion of the PV waveform (e.g., the ion current portion) provided to the bias electrode 104 by the PV waveform generator 175, which creates a high voltage sheath above the substrate 103. The high voltage sheath allows the plasma generated positive ions to be accelerated towards the biased substrate 103 during the ion current stage, and thus, for RIE processes, controls the amount and characteristics of the etching process that occurs on the surface of the substrate 103 during the plasma processing. The sheath collapse stage includes a positive voltage swing 240 (e.g., as a result of the positive wafer voltage), and the ion current stage includes a negative voltages swing (e.g., as a result of the positive wafer voltage), as illustrated in FIG. 2. In some embodiments, it is desirable for the ion current stage to include a region of the PV waveform that achieves the voltage at the substrate 103 that is stable or minimally varying throughout the stage, as illustrated in FIG. 2 by the waveform 230. One will note that significant variations in the voltage established at the substrate 103 during the ion current stage, such as shown by the positive slope in the waveform 225, will undesirably cause a variation in the ion energy distribution (IED) and thus cause undesirable characteristics of the etched features to be formed in the substrate 103 during the RIE process. Plasma sheath impedance varies with supplied PV waveform voltages. The RF match 172 can use either or both of the synchronization signals and/or use its internal sensors to sample impedances in different processing phases. In one example, a synchronization signal or characteristics determined by the input sensor 116 or the output sensor 117 are used to trigger the RF match 172 to determine at least two different impendences at different processing stages. Then, the RF match 172 updates its matching point based on the at least two different impedances.

Process Monitoring and Control Examples

Figure 3:
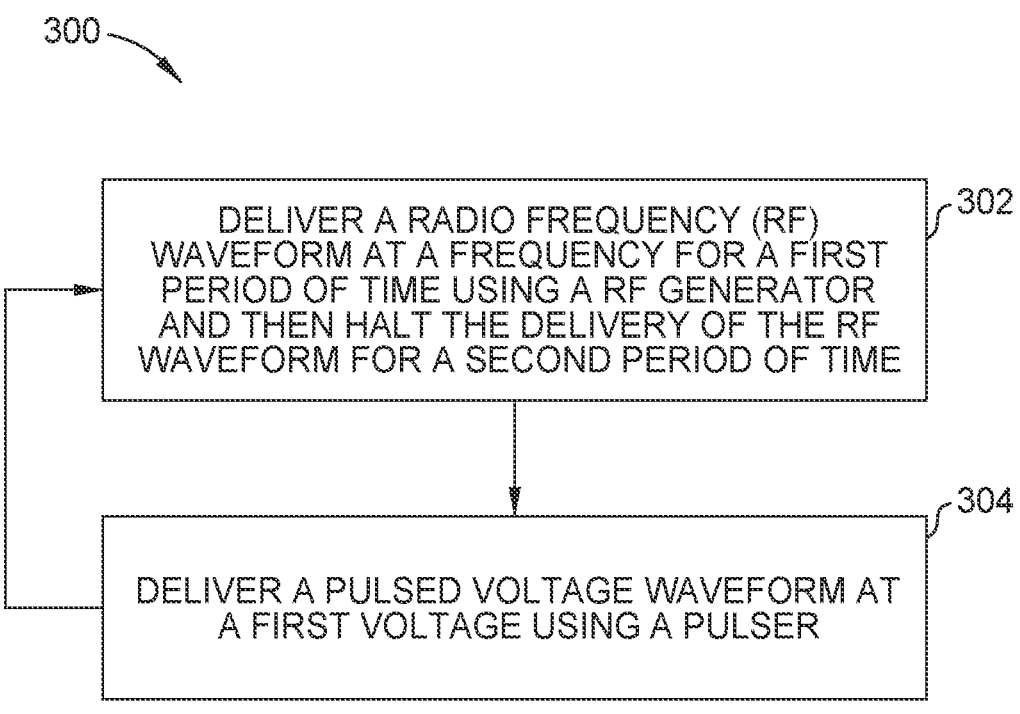
FIG. 3 is a flow diagram illustrating a method of waveform generation, according to one or more of the embodiments described herein.
Figure 4:
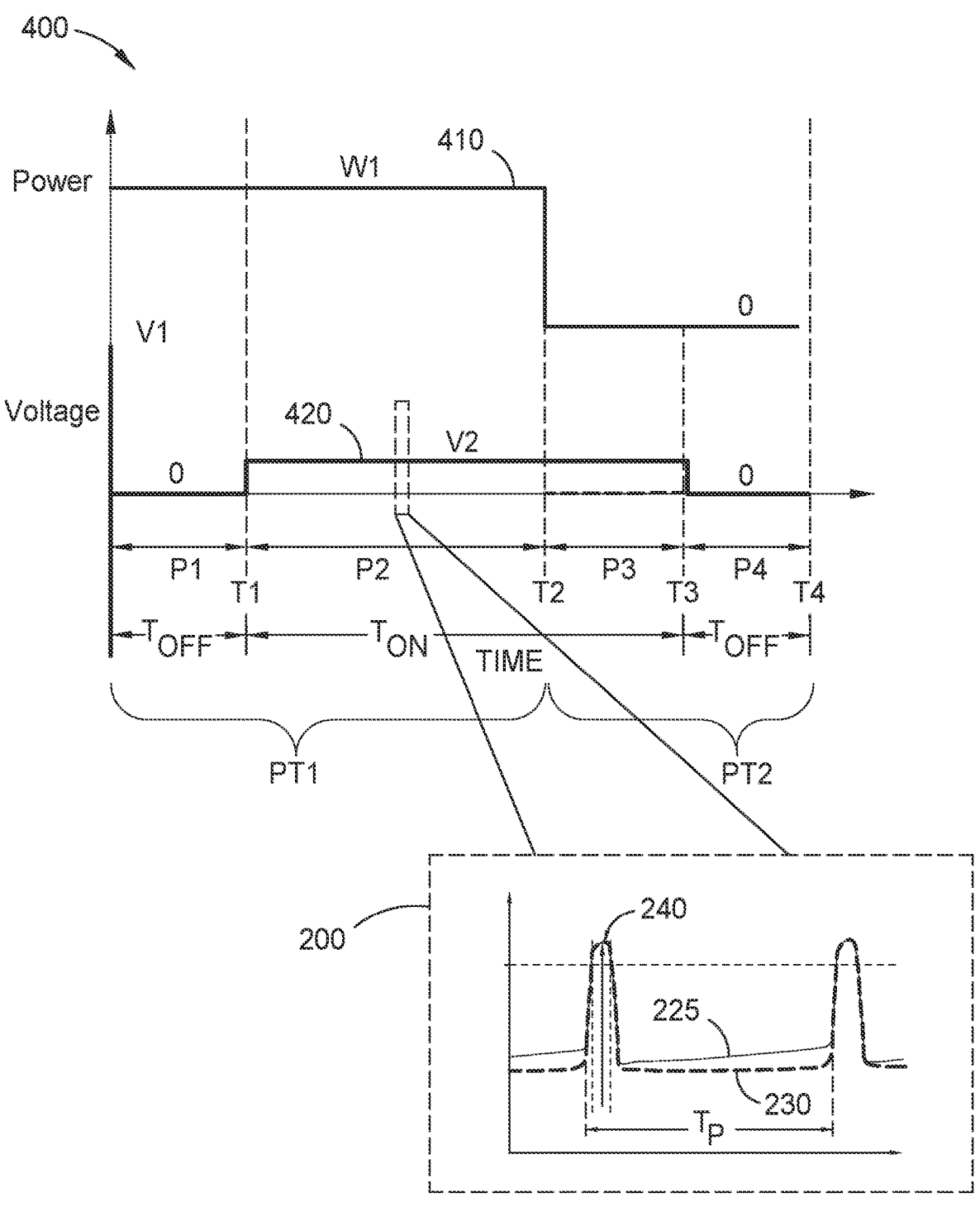
FIG. 4 illustrates a graph of example radio frequency (RF) generator power used to generate an RF waveform and example pulser voltage used to generate a pulsed voltage waveform during the method of waveform generation, according to one or more of the embodiments described herein.

FIG. 3 is a flow diagram illustrating a method 300 of waveform generation, according to one or more of the embodiments described herein. FIG. 4 illustrates a graph 400 of example RF generator power 410 used to generate an RF waveform and example pulser voltage 420 used to generate a PV waveform during the method 300 of waveform generation, according to one or more of the embodiments described herein. Therefore, FIGS. 3 and 4 are herein described together for clarity. In some embodiments, modes of operation other than the method 300 may be used to enable the delivering of a PV waveform after halting the delivery of a RF waveform.

The method 300 includes, at activity 302, delivering a RF waveform at a frequency for a first period of time PT1 and then halting the delivery of the RF waveform for a second period of time PT2 using a RF generator (e.g., RF generator 171). The RF waveform may include a series of RF pulses. In some embodiments, the first period of time PT1 can include a first sub-period of time P1 and a second sub-period of time P2, and the second period of time PT2 can include a third sub-period of time P3 and a fourth sub-period of time P4. The first period of time PT1 and the second period of time PT2 can be cyclically repeated to form a series of RF pulses that each have a period (e.g., RF pulse period) that is equal to the sum of the first period of time PT1 and the second period of time PT2, or stated another way the sum of the first, second, third and fourth sub-periods of time. To deliver the RF waveform, the RF generator may provide the RF generator power 410 to an upper electrode (e.g., the chamber lid 123) and/or a lower electrode (e.g., RF baseplate 137) of a processing chamber (e.g., processing chamber 100). In some cases, the RF generator power 410 may be provided at power W1 to generate the RF waveform, and the power W1 may be 300 watts (w). The power W1 may be between 50 w and 8000 w. The RF waveform may be a sinusoidal waveform, and the frequency at which the RF waveform is delivered may be 13.56 MHz. In some embodiments, the second sub-period of time P2 begins at the end of the first sub-period of time P1 (e.g., at time T1), the third sub-period of time P3 begins at the end of the second sub-period of time P2 (e.g., at time T2), and the fourth sub-period of time P4 begins at the end of the third sub-period of time P3 (e.g., at time T3), as illustrated in FIG. 4 In some cases, it is desirable to adjust one or more of the RF waveform and/or PV waveform processing parameters during one or more of the plasma processing cycles of the repeated activities 302 and 304 that are performed multiple times. In one example, it may be desirable to adjust at least one of the RF pulse period, RF pulse duty cycle, the burst period $T_{BD}$, the voltage pulse burst duty cycle, the ignition voltage (e.g., second voltage V1), the first voltage V2, the voltage pulse period $T_P$, the RF power W1, and/or one or more of the sub-periods of time during one or more of the repeated cycles. As illustrated in FIGS. 3 and 4 and discussed in relation to method 300, the RF waveform provided by the RF generator may be asynchronously pulsed with the delivery of a PV waveform to ignite and/or sustain a plasma within a processing region of a plasma processing chamber.

It is believed that after the delivery of the RF waveform for the first period of time PT1, which includes the first sub-period of time P1 and second sub-period of time P2, the RF generator is turned off (e.g., the delivery of the RF waveform is halted). The removal of the RF power will cause a sudden drop in electron temperature and electron density in the plasma, and the number of electrons within the plasma will decay. It is believed that during the early stages of the RF "off" period, a large percentage of the fast electrons will be lost due to recombination or bombardment of the chamber walls, which will then leave a higher percentage of low energy electrons within the plasma until the plasma becomes extinguished after a period of time has elapsed. In some embodiments, it is desirable to assure that the second period of time PT2 is short enough to prevent the plasma from extinguishing during the one or more of the repeated cycles. The early stages of the RF "off" period of an RF pulse are often referred to as the afterglow period that can include a near-afterglow period, where the ion-ion plasma and weakly energetic electrons remain, and the plasma density is slowly decaying.

As noted above, during the near-afterglow period, which includes the third sub-period of time P3, a portion of a burst of voltage pulses of the PV waveform is provided by the pulser. The portion of the burst of voltage pulses causes the breakdown of the plasma during the near-afterglow period to occur at a lower rate than when the RF waveform provided to the plasma during the first period of time PT1. As a result, the PV waveform does not cause any densification in the plasma and generation of high energy electrons. Moreover, during the third period of time P3, collisions may occur between the fast ions (which had gained the momentum by crossing the high voltage sheath above the substrate 103 described above with respect to FIG. 2) and the slow neutrals in the plasma (e.g., plasma 101), which results in a charge exchange between the ions and the neutrals. As a result, the ions become slow ions, and the neutrals become fast neutrals. It is also believed that the processes performed herein will also have an effect on a narrower ion angular distribution function (IADF), and the charge exchange collision processes that generate directional neutrals. In addition, the PV waveform may be manipulated by changing the PV on-time, the duty cycle, the voltage pulse pulsing frequency, and the voltage set-point by modifying the pulser voltage 420 during the third period of time P3. It has been found that the techniques discussed herein enable the PV waveform to be used as an orthogonal knob for controlling the biasing of a plasma (e.g., plasma 101) during the third period of time P3 (e.g., the near-afterglow period). As a result, and as described above, a narrower IEDF and enhanced profile control during plasma-assisted etching processes may be achieved (e.g., when compared to plasma-assisted processes that utilize the RF generator to bias the plasma). The techniques discussed herein may be of particular help during clean-up plasma-assisted processes for high aspect ratio features.

Figure 5:
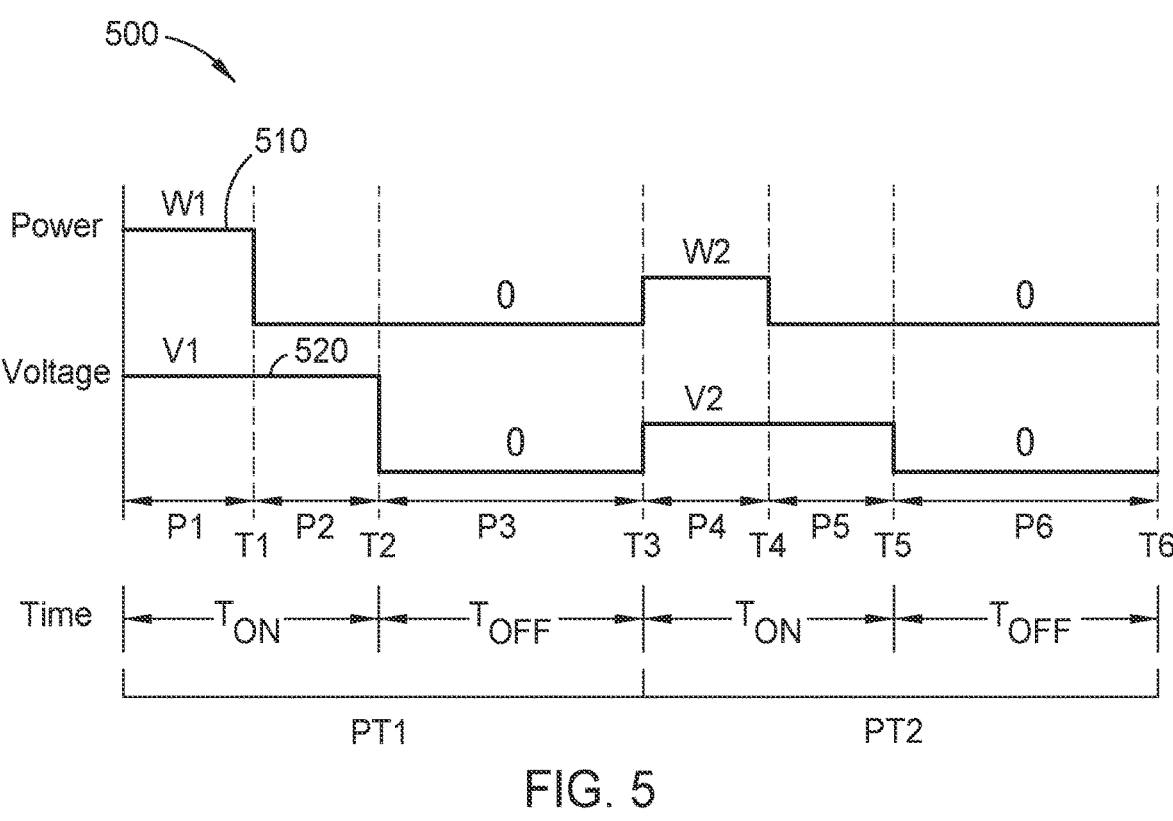
FIG. 5 illustrates another graph of example radio frequency (RF) generator power used to generate an RF waveform and example pulser voltage used to generate a pulsed voltage waveform, according to one or more of the embodiments described herein.

FIG. 5 illustrates graph 500 of example RF generator power 510 used to generate an RF waveform and example pulser voltage 520 used to generate a PV waveform, according to one or more of the embodiments described herein. The graph 500 may be substantially similar to the graph 400, but may represent a different pulsing scheme. In the pulsing scheme illustrated in the graph 500, the RF waveform is generated at a power W1 for a first sub-period of time P1, halted for a second sub-period of time P2 and a third sub-period of time P3 (e.g., the RF generator power 510 may be 0), generated at a power W2 for a fourth sub-period of time P4, and halted for a fifth sub-period of time P5 and a sixth sub-period of time P6 (e.g., the RF generator power 510 may be 0). The PV waveform is delivered at a first voltage V1 for the first sub-period of time P1 and the second sub-period of time P2, halted during the third sub-period of time P3 (e.g., the voltage delivered by the pulser may be 0), delivered at a second voltage V2 for the fourth sub-period of time P4 and the fifth sub-period of time P5, and halted during the sixth sub-period of time P6 (e.g., the voltage delivered by the pulser may be 0). In the pulsing scheme illustrated in the graph 500, each of the second sub-period of time P2 and the fifth sub-period of time P5 may be included in the near-afterglow period, and therefore the pulsing scheme may enable the benefits described above.

In the pulsing scheme illustrated in the graph 500, the power W1 may be higher than the power W2, and the first voltage V1 may be higher than the second voltage V2. In addition, the first sub-period of time P1, the second sub-period of time P2, and the third sub-period of time P3 may be 50% of the plasma processing cycle of the RF waveform (e.g., first period of time PT1), and the fourth sub-period of time P4, the fifth sub-period of time P5, and the sixth sub-period of time P6 may be 50% of the plasma processing cycle of the RF waveform (e.g., second period of time PT2).

Figure 6:
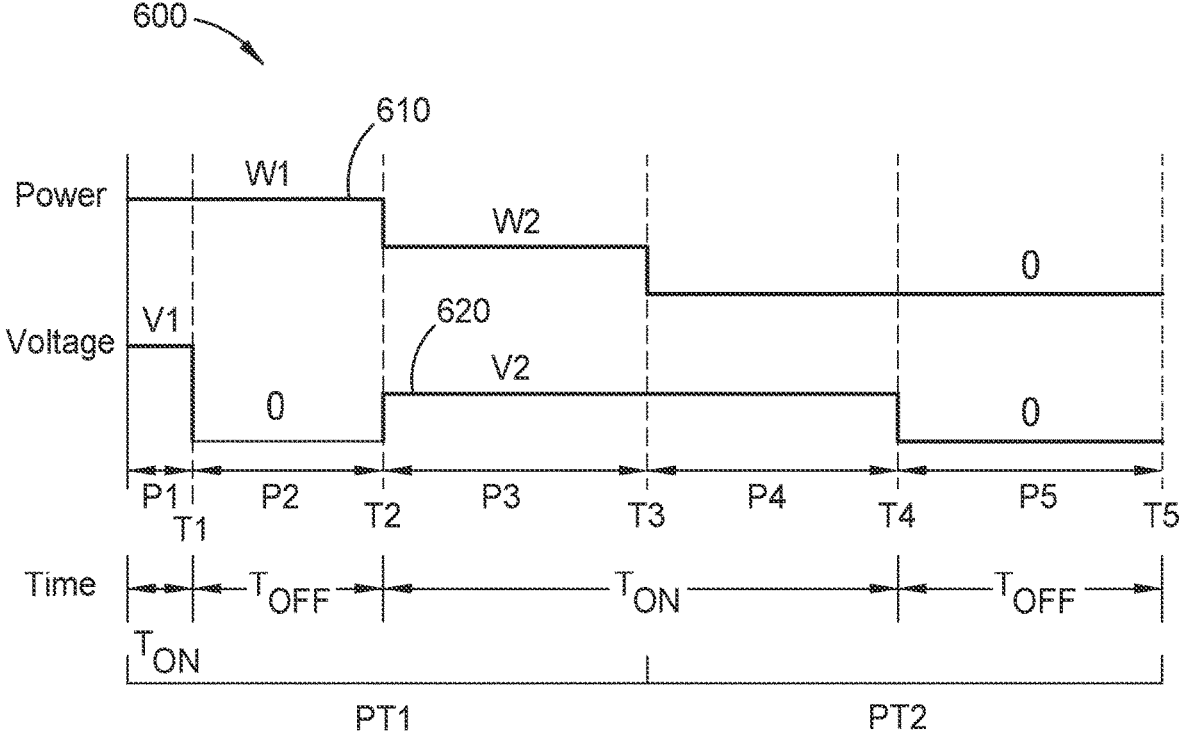
FIG. 6 illustrates another graph of example radio frequency (RF) generator power used to generate an RF waveform and example pulser voltage used to generate a pulsed voltage waveform, according to one or more of the embodiments described herein.

FIG. 6 illustrates graph 600 of example RF generator power 610 used to generate an RF waveform and example pulser voltage 620 used to generate a PV waveform, according to one or more of the embodiments described herein. The graph 600 may be substantially similar to the graph 400, but may represent a different pulsing scheme. In the pulsing scheme illustrated in the graph 600, the RF waveform is generated at a power W1 for a first sub-period of time P1 and a second sub-period of time P2, generated at a power W2 for a third sub-period of time P3, and halted for a fourth sub-period of time P4 and fifth sub-period of time P5 (e.g., the RF generator power 510 may be 0). The PV waveform is delivered at a first voltage V1 for the first sub-period of time P1, halted during the second sub-period of time P2 (e.g., the voltage delivered by the pulser may be 0), delivered at a second voltage V2 for the third sub-period of time P3 and the fourth sub-period of time P4, and halted during the fifth sub-period of time P5 (e.g., the voltage delivered by the pulser may be 0). In the pulsing scheme illustrated in the graph 600, the fourth sub-period of time P4 may be included in the near-afterglow period, and therefore the pulsing scheme may enable the benefits described above.

In the pulsing scheme illustrated in the graph 600, the power W1 may be higher than the power W2, and the first voltage V1 may be higher than the second voltage V2. In addition, the first sub-period of time P1 and the second sub-period of time P2 may be 20% of the plasma processing cycle of the RF waveform, the third sub-period of time P3 may be 30% of the plasma processing cycle of the RF waveform, and the fourth sub-period of time P4 and the fifth sub-period of time P5 may be 50% of the plasma processing cycle of the RF waveform. The first sub-period of time P1, the second sub-period of time P2, and third sub-period of time P3 may form a first period of time PT1, and the fourth sub-period of time P4 and the fifth sub-period of time P5 may form a second period of time PT2.

Figures 7, 8:
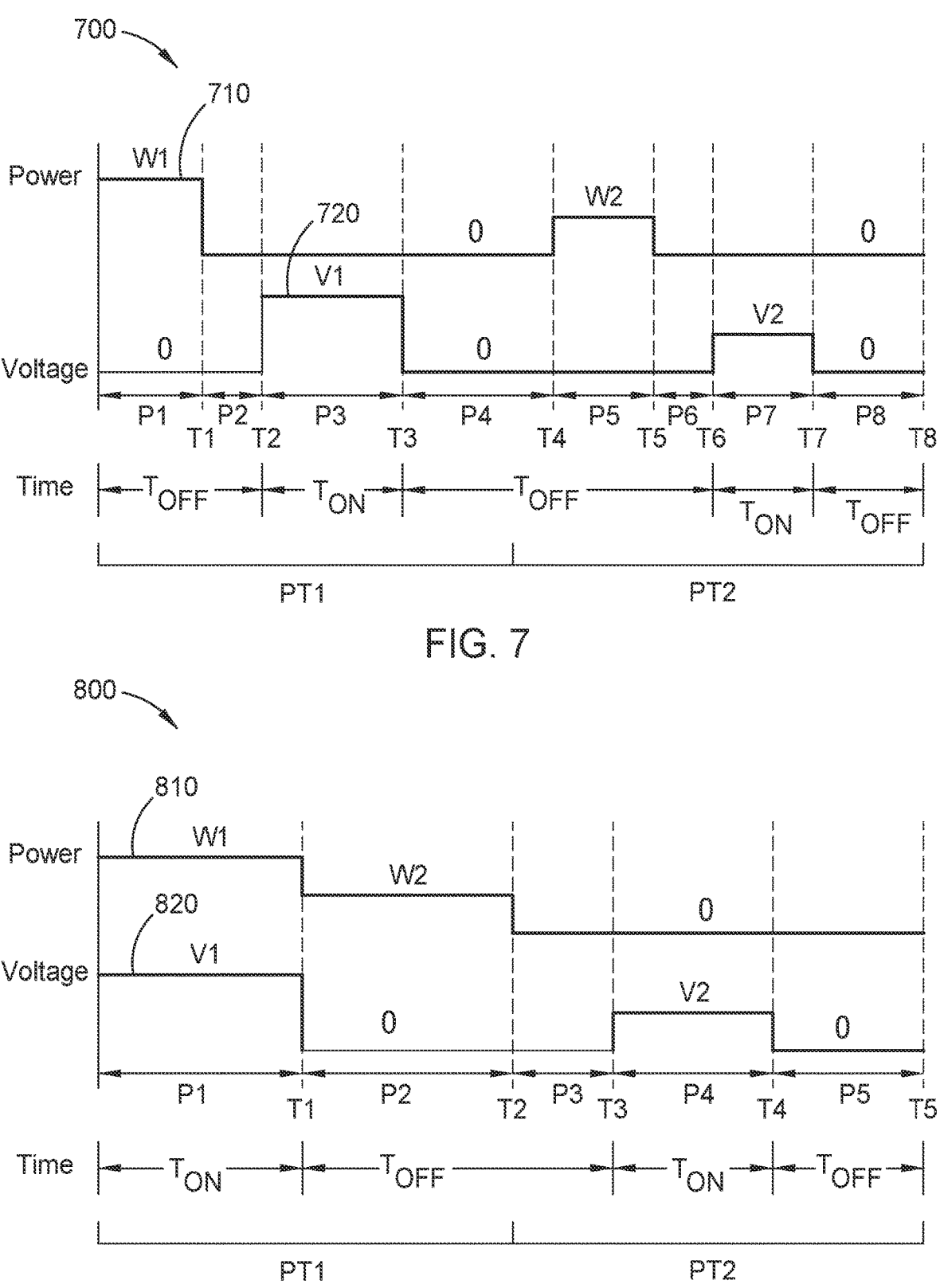
FIG. 7 illustrates another graph of example radio frequency (RF) generator power used to generate an RF waveform and example pulser voltage used to generate a pulsed voltage waveform, according to one or more of the embodiments described herein.
FIG. 8 illustrates another graph of example radio frequency (RF) generator power used to generate an RF waveform and example pulser voltage used to generate a pulsed voltage waveform, according to one or more of the embodiments described herein.

FIG. 7 illustrates graph 700 of example RF generator power 710 used to generate an RF waveform and example pulser voltage 720 used to generate a PV waveform, according to one or more of the embodiments described herein. The graph 700 may be substantially similar to the graph 400, but may represent a different pulsing scheme. In the pulsing scheme illustrated in the graph 700, the RF waveform is generated at a power W1 for a first sub-period of time P1, halted for a second sub-period of time P2, a third sub-period of time P3, and a fourth sub-period of time P4 (e.g., the RF generator power 510 may be 0), generated at a power W2 for a fifth sub-period of time P5, and halted for a sixth sub-period of time P6, a seventh sub-period of time P7, and an eighth sub-period of time P8 (e.g., the RF generator power 510 may be 0). The PV waveform is not delivered for the first sub-period of time P1 and the second sub-period of time P2, delivered at a first voltage V1 for the third sub-period of time P3, halted during the fourth sub-period of time P4, the fifth sub-period of time P5, and the sixth sub-period of time P6 (e.g., the voltage delivered by the pulser may be 0), delivered at a second voltage V2 for the seventh sub-period of time P7, and halted during the eighth sub-period of time P8 (e.g., the voltage delivered by the pulser may be 0). In the pulsing scheme illustrated in the graph 700, each of the third sub-period of time P3 and the seventh sub-period of time P7 may be included in the near-afterglow period, which occurs after a delay (e.g., the second sub-period of time P2 and the sixth sub-period of time P6, respectively). In this manner, the pulsing scheme illustrated in the graph 700 may enable the benefits described above.

In the pulsing scheme illustrated in the graph 700, the power W1 may be higher than the power W2, and the first voltage V1 may be higher than the second voltage V2. In addition, the first sub-period of time P1, the second sub-period of time P2, the third sub-period of time P3, and the fourth sub-period of time P4 may be 50% of the plasma processing cycle of the RF waveform (e.g., first period of time PT1), and the fifth sub-period of time P5, the sixth sub-period of time P6, the seventh sub-period of time P7, and the eighth sub-period of time P8 may be 50% of the plasma processing cycle of the RF waveform (e.g., second period of time PT2).

FIG. 8 illustrates graph 800 of example RF generator power 810 used to generate an RF waveform and example pulser voltage 820 used to generate a PV waveform, according to one or more of the embodiments described herein. The graph 800 may be substantially similar to the graph 400, but may represent a different pulsing scheme. In the pulsing scheme illustrated in the graph 800, the RF waveform is generated at a power W1 for a first sub-period of time P1, generated at a power W2 for a second sub-period of time P2, and halted during a third sub-period of time P3, a fourth sub-period of time P4, and a fifth sub-period of time P5 (e.g., the RF generator power 510 may be 0). The PV waveform is delivered at a first voltage V1 for the first sub-period of time P1, halted during the second sub-period of time P2 and the third sub-period of time P3 (e.g., the voltage delivered by the pulser may be 0), delivered at a second voltage V2 for the fourth sub-period of time P4, and halted during the fifth sub-period of time P5 (e.g., the voltage delivered by the pulser may be 0). In the pulsing scheme illustrated in the graph 800, the fourth sub-period of time P4 may be included in the near-afterglow period, which occurs after a delay (e.g., the third sub-period of time P3). In this manner, the pulsing scheme illustrated in the graph 800 may enable the benefits described above.

In the pulsing scheme illustrated in the graph 800, the power W1 may be higher than the power W2, and the first voltage V1 may be higher than the second voltage V2. In addition, the first sub-period of time P1 may be 20% of the plasma processing cycle of the RF waveform, the second sub-period of time P2 may be 30% of the plasma processing cycle of the RF waveform, and the third sub-period of time P3, the fourth sub-period of time P4, and the fifth sub-period of time P5 may be 50% of the plasma processing cycle of the RF waveform. The first sub-period of time P1 and the second sub-period of time P2 may form a first period of time PT1, and the third sub-period of time, the fourth sub-period of time P4, and the fifth sub-period of time P5 may form a second period of time PT2.

In some embodiments, the method 300 and the operations described herein may be performed by a system controller (e.g., the system controller 126 of FIG. 1). The system controller may include memory that includes computer-executable instructions and one or more processors configured to execute the computer-executable instructions and cause a waveform generator (e.g., a waveform generator that includes the RF generator 171 and the PV waveform generator 175) to perform the method 300 and any other operations described herein.

Additional Considerations

In the above description, details are set forth by way of example to facilitate an understanding of the disclosed subject matter. It should be apparent to a person of ordinary skill in the field, however, that the disclosed implementations are exemplary and not exhaustive of all possible implementations. Thus, it should be understood that reference to the described examples is not intended to limit the scope of the disclosure. Any alterations and further modifications to the described devices, instruments, methods, and any further application of the principles of the present disclosure are fully contemplated as would normally occur to one skilled in the art to which the disclosure relates. In particular, it is fully contemplated that the features, components, and/or steps described with respect to one implementation may be combined with the features, components, and/or steps described with respect to other implementations of the present disclosure. As used herein, the term "about" may refer to a +/−10% variation from the nominal value. It is to be understood that such a variation can be included in any value provided herein.

As used herein, "a processor," "at least one processor" or "one or more processors" generally refers to a single processor configured to perform one or multiple operations or multiple processors configured to collectively perform one or more operations. In the case of multiple processors, performance of the one or more operations could be divided amongst different processors, though one processor may perform multiple operations, and multiple processors could collectively perform a single operation. Similarly, "a memory," "at least one memory" or "one or more memories" generally refers to a single memory configured to store data and/or instructions, multiple memories configured to collectively store data and/or instructions.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

While the foregoing is directed to embodiments of the present disclosure, other and further embodiments of the disclosure may be devised without departing from the basic scope thereof, and the scope thereof is determined by the claims that follow.

We claim:

1. A method for waveform generation, comprising:
delivering a radio frequency (RF) waveform at a frequency for a first period of time using a RF generator and then halting the delivery of the RF waveform for a second period of time to reduce electron temperature and electron density in plasma and produce a near-afterglow plasma state; and
delivering a pulsed voltage waveform at a first voltage for at least a portion of a third period of time using a pulser, wherein the delivery of the pulsed voltage waveform occurs during at least a portion of the near-afterglow plasma state and overlaps with the halting of the delivery of the RF waveform during a portion of the second period of time.

2. The method of claim 1, wherein at least one process parameter of the pulsed voltage waveform is adjusted during the near-afterglow plasma state to control ion energy or sheath potential, the process parameter comprising one or more of a pulse duty cycle, voltage setpoint, pulse frequency, or pulse burst length.

3. The method of claim 1, further comprising generating a synchronization signal between the RF generator and a pulsed voltage waveform generator to coordinate timing of the RF waveform and the pulsed voltage waveform.

4. The method of claim 1, wherein the pulsed voltage waveform comprises a pulse with a positive voltage swing and a negative voltage swing.

5. The method of claim 1, wherein the first period of time includes a first sub-period of time and a second sub-period of time, wherein the second period of time includes a third sub-period of time and a fourth sub-period of time, wherein the portion of the second period of time includes the third sub-period of time, and wherein the second sub-period of time begins at an end of the first sub-period of time, the third sub-period of time begins at an end of the second sub-period of time, and the fourth sub-period of time begins at an end of the third sub-period of time.

6. The method of claim 5, wherein the first sub-period of time is 20% of a cycle of the RF waveform and the pulsed voltage waveform.

7. The method of claim 5, wherein the second sub-period of time is 40% of a cycle of the RF waveform and the pulsed voltage waveform, the third sub-period of time is 20% of a cycle of the RF waveform and the pulsed voltage waveform, and wherein the fourth sub-period of time is 20% of a cycle of the RF waveform and the pulsed voltage waveform.

8. The method of claim 1, wherein the pulsed voltage waveform does not overlap with the RF waveform during the portion of the second period of time.

9. The method of claim 1, wherein the pulsed voltage waveform overlaps with the RF waveform during the portion of the second period of time.

10. The method of claim 1, further comprising:
delivering the RF waveform at the first frequency for a fourth period of time using the RF generator and then halting the delivery of the RF waveform for a fifth period of time; and
delivering the pulsed voltage waveform at the first voltage for at least a portion of a sixth period of time using the pulser, wherein the delivery of the pulsed voltage waveform overlaps with the halting of the delivery of the RF waveform during a portion of the fifth period of time.

11. A waveform generator, comprising:
a system controller coupled to the waveform generator, the system controller comprising memory that includes computer-executable instructions and one or more processors configured to execute the computer-executable instructions and cause the waveform generator to:

deliver a radio frequency (RF) waveform at a frequency for a first period of time using a RF generator and then halt the delivery of the RF waveform for a second period of time to reduce electron temperature and electron density in plasma and produce a near-afterglow plasma state; and deliver a pulsed voltage waveform at a first voltage for at least a portion of a third period of time using a pulser, wherein the delivery of the pulsed voltage waveform occurs during at least a portion of the near-afterglow plasma state and overlaps with the halting of the delivery of the RF waveform during a portion of the second period of time.

12. The waveform generator of claim 11, wherein at least one process parameter of the pulsed voltage waveform is adjusted during the near-afterglow plasma state to control ion energy or sheath potential, the process parameter comprising one or more of a pulse duty cycle, voltage setpoint, pulse frequency, or pulse burst length.

13. The waveform generator of claim 11, wherein a synchronization signal is generated between the RF generator and the waveform generator to coordinate timing of the RF waveform and the pulsed voltage waveform.

14. The waveform generator of claim 11, wherein the pulsed voltage waveform comprises a pulse with a positive voltage swing and a negative voltage swing.

15. The waveform generator of claim 11, wherein the first period of time includes a first sub-period of time and a second sub-period of time, wherein the second period of time includes a third sub-period of time and a fourth sub-period of time, wherein the portion of the second period of time includes the third sub-period of time, and wherein the second sub-period of time begins at an end of the first sub-period of time, the third sub-period of time begins at an end of the second sub-period of time, and the fourth sub-period of time begins at an end of the third sub-period of time.

16. The waveform generator of claim 15, wherein the first sub-period of time is 20% of a cycle of the RF waveform and the pulsed voltage waveform, and wherein the second sub-period of time is 40% of a cycle of the RF waveform and the pulsed voltage waveform.

17. The waveform generator of claim 15, wherein the third sub-period of time is 20% of a cycle of the RF waveform and the pulsed voltage waveform, and wherein the fourth sub-period of time is 20% of a cycle of the RF waveform and the pulsed voltage waveform.

18. The waveform generator of claim 11, wherein the one or more processors are configured to execute the computer-executable instructions and cause the waveform generator to deliver the pulsed voltage waveform at the first voltage for at least the portion of the third period of time such that the pulsed voltage waveform does not overlap with the RF waveform during the portion of the second period of time.

19. The waveform generator of claim 11, wherein the one or more processors are configured to execute the computer-executable instructions and cause the waveform generator to deliver the pulsed voltage waveform at the first voltage for at least the portion of the third period of time such that the pulsed voltage waveform overlaps with the RF waveform during the portion of the second period of time.

20. The waveform generator of claim 11, wherein the memory includes further computer-executable instructions which when executed by the one or more processors causes the waveform generator to:

deliver the RF waveform at the first frequency for a fourth period of time using the RF generator and then halting the delivery of the RF waveform for a fifth period of time; and deliver the pulsed voltage waveform at the first voltage for at least a portion of a sixth period of time using the pulser, wherein the delivery of the pulsed voltage waveform overlaps with the halting of the delivery of the RF waveform during a portion of the fifth period of time.

* * * * *